(12) United States Patent
Zhou et al.

(10) Patent No.: US 12,101,081 B2
(45) Date of Patent: Sep. 24, 2024

(54) SURFACE ACOUSTIC WAVE RESONATOR DEVICE AND METHOD OF MANUFACTURING THE SAME, FILTER

(71) Applicant: Shenzhen Newsonic Technologies Co., Ltd., Guangdong (CN)

(72) Inventors: Chencheng Zhou, Guangdong (CN); Jie Zou, Guangdong (CN); Gongbin Tang, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/416,399

(22) Filed: Jan. 18, 2024

(65) Prior Publication Data
US 2024/0195385 A1    Jun. 13, 2024

(30) Foreign Application Priority Data

Sep. 1, 2023 (CN) .......................... 202311116941.7

(51) Int. Cl.
| | |
|---|---|
| *H03H 9/25* | (2006.01) |
| *H03H 3/08* | (2006.01) |
| *H03H 9/02* | (2006.01) |
| *H03H 9/64* | (2006.01) |

(52) U.S. Cl.
CPC ................ *H03H 9/25* (2013.01); *H03H 3/08* (2013.01); *H03H 9/02834* (2013.01); *H03H 9/64* (2013.01)

(58) Field of Classification Search
CPC ........ H03H 9/25; H03H 9/02834; H03H 9/64; H03H 3/08
See application file for complete search history.

(56) References Cited

U.S. PATENT DOCUMENTS 11,652,466 B2 * 5/2023 Fujiwara .................. H03H 9/25
333/193

FOREIGN PATENT DOCUMENTS

CN         115296642 A    11/2022

* cited by examiner

*Primary Examiner* — Samuel S Outten
(74) *Attorney, Agent, or Firm* — Leason Ellis LLP

(57) ABSTRACT

A surface acoustic wave resonator device, its manufacturing method, and a filter are disclosed. The device includes a piezoelectric substrate, and an interdigital transducer on a side of the substrate, having an interdigital electrode region, and including a first interdigital electrode and a first interdigital electrode lead-out part connected to each other, and a second interdigital electrode and a second interdigital electrode lead-out part connected to each other. The first and second interdigital electrodes are located in the interdigital electrode region, extending along a first direction and alternately arranged in a second direction. The first and second interdigital electrode lead-out parts are located on opposite sides of the interdigital electrode region. A first conductive structure and a second conductive structure overlap with end portions of the interdigital electrodes and are electrically connected to the corresponding interdigital electrodes, respectively.

20 Claims, 11 Drawing Sheets

SURFACE ACOUSTIC WAVE RESONATOR DEVICE AND METHOD OF MANUFACTURING THE SAME, FILTER

CROSS-REFERENCE TO RELATED APPLICATION(S)

The application claims priority to the Chinese patent application No. 202311116941.7, filed on Sep. 1, 2023, the entire disclosure of which is incorporated herein by reference as part of the present application.

TECHNICAL FIELD

The embodiments of the present disclosure relate to a surface acoustic wave resonator device, a method of manufacturing the same, and a filter.

BACKGROUND

With the rapid development of mobile communication technology, filters based on resonators are becoming more and more widely used in communication devices such as smartphones. Surface acoustic wave (SAW) filters, as a type of acoustic wave filters, have the advantages of small size and light weight, etc. In a surface acoustic wave filter, suppression of clutter wave may be achieved through disposing a metal structure over the interdigital electrodes. However, such a metal structure may adversely affect the reliability of the resonator device while suppressing clutter wave.

SUMMARY

At least one embodiment according to the disclosure provides a surface acoustic wave resonator device, its manufacturing method, and a filter, which can achieve the suppression of clutter in both the resonator device and the filter, while ensuring the device reliability of the resonator device.

At least one embodiment of the disclosure provides a surface acoustic wave resonator device, including: a piezoelectric substrate; an interdigital transducer, disposed on a side of the piezoelectric substrate, having an interdigital electrode region, and including a first interdigital electrode and a first interdigital electrode lead-out part connected to each other, and a second interdigital electrode and a second interdigital electrode lead-out part connected to each other; wherein the first interdigital electrode and the second interdigital electrode are located in the interdigital electrode region, extending along a first direction and alternately arranged in a second direction, the first direction intersects the second direction; the first interdigital electrode lead-out part and the second interdigital electrode lead-out part are located on opposite sides of the interdigital electrode region in the first direction; a first intermediate layer, disposed on the side of the piezoelectric substrate and covers the interdigital transducer; and a first conductive structure and a second conductive structure, located on a side of the first intermediate layer away from the piezoelectric substrate, and spaced apart from each other in the first direction, wherein each of the first conductive structure and the second conductive structure is overlapped with end portions of the first interdigital electrode and the second interdigital electrode in a third direction perpendicular to a main surface of the piezoelectric substrate, wherein the first conductive structure is electrically connected to one of the first interdigital electrode and the second interdigital electrode, and the second conductive structure is electrically connected to the other one of the first interdigital electrode and the second interdigital electrode.

In the surface acoustic wave resonator device according to at least one embodiment of the disclosure, the first interdigital electrode and the second interdigital electrode each include a central part, a first end part, a second end part and a connection part, and in each interdigital electrode, the first end part and the second end part are located on opposite sides of the central part in the first direction, and the connection part is located on a side of the second end part away from the central part, and connected to a corresponding one of the first interdigital electrode lead-out part and the second interdigital electrode lead-out part; the first conductive structure includes a first conductive body part and a first conductive extension part connected to each other, the first conductive body part is overlapped with the second end part of the first interdigital electrode and the first end part of the second interdigital electrode in the third direction, and the first conductive body part is electrically connected to the first interdigital electrode through the first conductive extension part; and the second conductive structure includes a second conductive body part and a second conductive extension part connected to each other, the second conductive body part is overlapped with the first end part of the first interdigital electrode and the second end of the second interdigital electrode in the third direction, and the second conductive body part is electrically connected to the second interdigital electrode through the second conductive extension part.

The surface acoustic wave resonator device according to at least one embodiment of the disclosure further includes: a first conductive connector, extending through the first intermediate layer to connect with the first interdigital electrode lead-out part, and electrically connected to the first interdigital electrode through the first interdigital electrode lead-out part; and a second conductive connector, extending through the first intermediate layer to connect with the second interdigital electrode lead-out part, and electrically connected to the second interdigital electrode through the second interdigital electrode lead-out part, wherein the first conductive structure is electrically connected to first interdigital electrode through the first conductive connector, and the second conductive structure is electrically connected to the second interdigital electrode through the second conductive connector.

In the surface acoustic wave resonator device according to at least one embodiment of the disclosure, the first conductive extension part and the second conductive extension part are located on a side of the first intermediate layer away from the piezoelectric substrate; the first conductive extension part extends from the first conductive body part to being connected with the first conductive connector, and is further electrically connected to the first interdigital electrode through the first conductive connector; the second conductive extension part extends from the second conductive body part to being connected with the second conductive connector, and is further electrically connected to the second interdigital electrode through the second conductive connector.

In the surface acoustic wave resonator device according to at least one embodiment of the disclosure, an orthographic projection of the first conductive extension part on the piezoelectric substrate borders or overlaps an orthographic projection of the first conductive connector on the piezoelectric substrate, and an orthographic projection of the second conductive extension part on the piezoelectric substrate borders or overlaps an orthographic projection of the second conductive connector on the piezoelectric substrate.

In the surface acoustic wave resonator device according to at least one embodiment of the disclosure, the first conductive connector is in contact with a sidewall of the first conductive extension part, and the second conductive connector is in contact with a sidewall of the second conductive extension part.

In the surface acoustic wave resonator device according to at least one embodiment of the disclosure, the first conductive connector further covers a portion of a surface of the first conductive extension part away from the first intermediate layer; and/or the second conductive connector further covers a portion of a surface of the second conductive extension part away from the first intermediate layer.

In the surface acoustic wave resonator device according to at least one embodiment of the disclosure, the first conductive extension part overlaps the connection part of the first interdigital electrode in the third direction; and/or the second conductive extension part overlaps the connection part of the second interdigital electrode in the third direction.

In the surface acoustic wave resonator device according to at least one embodiment of the disclosure, the first conductive extension part overlaps the first interdigital electrode lead-out part in the third direction; and/or the second conductive extension part overlaps the second interdigital electrode lead-out part in the third direction.

In the surface acoustic wave resonator device according to at least one embodiment of the disclosure, a sidewall of the first conductive body part is aligned with a sidewall of the first end part of the second interdigital electrode in the third direction; and/or a sidewall of the second conductive body part is aligned with a sidewall of the first end part of the first interdigital electrode in the third direction.

In the surface acoustic wave resonator device according to at least one embodiment of the disclosure, the first conductive extension part is located between the first conductive body part and the first interdigital electrode in the third direction and extends through the first intermediate layer to connect the first conductive body part to the first interdigital electrode; and/or the second conductive extension part is located between the second conductive body part and the second interdigital electrode in the third direction and extends through the first intermediate layer to connect the second conductive body part to the second interdigital electrode.

In the surface acoustic wave resonator device according to at least one embodiment of the disclosure, the first conductive structure and the second conductive structure constitute a clutter suppression structure.

In the surface acoustic wave resonator device according to at least one embodiment of the disclosure, the first intermediate layer includes a temperature compensation layer.

In the surface acoustic wave resonator device according to at least one embodiment of the disclosure, the first intermediate layer includes: a first intermediate sublayer, extending along a surface of the interdigital transducer on the piezoelectric substrate; and a second intermediate sublayer, located on a side of the first intermediate sublayer away from the piezoelectric substrate, and the first intermediate sublayer and the second intermediate sublayer include different materials; wherein the interdigital transducer and the second intermediate sublayer are separated by the first intermediate sublayer.

The surface acoustic wave resonator device according to at least one embodiment of the disclosure further includes a second intermediate layer, located on a side of the first intermediate layer away from the piezoelectric substrate, and covers the first conductive structure and the second conductive structure.

In the surface acoustic wave resonator device according to at least one embodiment of the disclosure, at least a portion of the first intermediate layer and at least a portion of the second intermediate layer together constitute a temperature compensation layer.

In the surface acoustic wave resonator device according to at least one embodiment of the disclosure, the second intermediate layer includes: a third intermediate sublayer, disposed on the first intermediate layer and covering the first conductive structure and the second conductive structure; and a fourth intermediate sublayer, located on a side of the third intermediate sublayer away from the first intermediate layer, and the third intermediate sublayer and the fourth intermediate sublayer include different materials, wherein the third intermediate sublayer separates the first conductive structure from the fourth intermediate sublayer, and separates the second conductive structure from the fourth intermediate sublayer.

At least one embodiment of the disclosure provides a filter, including the surface acoustic wave resonator device according to any items as mentioned above.

At least one embodiment of the disclosure provides a method of manufacturing a surface acoustic wave resonator device, including: providing a piezoelectric substrate; forming an interdigital transducer on the piezoelectric substrate, wherein the interdigital transducer has an interdigital electrode region, and includes a first interdigital electrode and a first interdigital electrode lead-out part connected to each other, and a second interdigital electrode and a second interdigital electrode lead-out part connected to each other; the first interdigital electrode and the second interdigital electrode are located in the interdigital electrode region, extending along a first direction and alternately arranged in a second direction, the first direction intersects the second direction; the first interdigital electrode lead-out part and the second interdigital electrode lead-out part are located on opposite sides of the interdigital electrode region in the first direction; forming a first intermediate layer on a side of the piezoelectric substrate to cover the interdigital transducer; and forming a first conductive structure and a second conductive structure on a side of the first intermediate layer away from the piezoelectric substrate, wherein the first conductive structure and the second conductive structure are spaced apart from each other in the first direction, and each of the first conductive structure and the second conductive structure is overlapped with end portions of the first interdigital electrode and the second interdigital electrode in a third direction perpendicular to a main surface of the piezoelectric substrate, wherein the first conductive structure is electrically connected to one of the first interdigital electrode and the second interdigital electrode, and the second conductive structure is electrically connected to the other one of the first interdigital electrode and the second interdigital electrode.

In the method of manufacturing the surface acoustic wave resonator device according to at least one embodiment of the disclosure further includes: forming a first conductive connector extending through the first intermediate layer to connect with the first interdigital electrode lead-out part; and forming a second conductive connector extending through the first intermediate layer to connect with the second interdigital electrode lead-out part, wherein the first conductive connector is further connected to the first conductive structure, and the second conductive connector is further connected to the second conductive structure.

In the method of manufacturing the surface acoustic wave resonator device according to at least one embodiment of the disclosure, the first conductive connector contacts at least a sidewall of the first conductive structure, and the second conductive connector contacts at least a sidewall of the second conductive structure.

The method of manufacturing the surface acoustic wave resonator device according to at least one embodiment of the disclosure further includes: forming a second intermediate layer on a side of the first intermediate layer away from the piezoelectric substrate to cover the first conductive structure and the second conductive structure, wherein forming the first conductive connector and the second conductive connector includes: performing a patterning process on the second intermediate layer and the first intermediate layer to form a first opening and a second opening, wherein the first opening extends through the second intermediate layer and the first intermediate layer to expose a portion of a surface of the first interdigital electrode lead-out part, and further expose at least a sidewall of the first conductive structure, and the second opening extends through the second intermediate layer and the first intermediate layer to expose a portion of a surface of the second interdigital electrode lead-out part, and further expose at least a sidewall of the second conductive structure; and forming the first conductive connector in the first opening and forming the second conductive connector in the second opening.

In the method of manufacturing the surface acoustic wave resonator device according to at least one embodiment of the disclosure, the first opening further exposes a portion of a surface of the first conductive structure away from the first intermediate layer, so that the first conductive connector further contacts the portion of the surface of the first conductive structure, and/or the second opening further exposes a portion of a surface of the second conductive structure away from the first intermediate layer, so that the second conductive connector further contacts the portion of the surface of the second conductive structure.

In the method of manufacturing the surface acoustic wave resonator device according to at least one embodiment of the disclosure, forming the first conductive structure and the second conductive structure includes: performing a patterning process on the first intermediate layer to form a first via hole and a second via hole, wherein the first via hole exposes a portion of a surface of the first interdigital electrode, and the second via hole exposes a portion of a surface of the second interdigital electrode; and forming a conductive material on the first intermediate layer and in the first via hole and the second via hole, and performing a patterning process on the conductive material to form the first conductive structure and the second conductive structure, wherein the first conductive structure is electrically connected to the first interdigital electrode through the first via hole, and the second conductive structure is electrically connected to the second interdigital electrode through the second via hole.

In the method of manufacturing the surface acoustic wave resonator device according to at least one embodiment of the disclosure, forming the first intermediate layer includes: forming a first intermediate sublayer on the piezoelectric substrate to cover the interdigital transducer; and forming a second intermediate sublayer on a side of the first intermediate sublayer away from the piezoelectric substrate, wherein the first intermediate sublayer and the second intermediate sublayer include different materials.

In the method of manufacturing the surface acoustic wave resonator device according to at least one embodiment of the disclosure, the second intermediate sublayer includes silicon oxide and is formed by a deposition process; and the first intermediate sublayer isolates the interdigital transducer from oxygen in the deposition chamber during formation of the second intermediate sublayer.

BRIEF DESCRIPTION OF DRAWINGS

In order to more clearly explain the technical solution of the embodiments of the present disclosure, the drawings of the embodiments will be briefly introduced below. It is obvious that the drawings in the following description only refer to some embodiments of the present disclosure, and are not the limitations of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

Figure 1A:
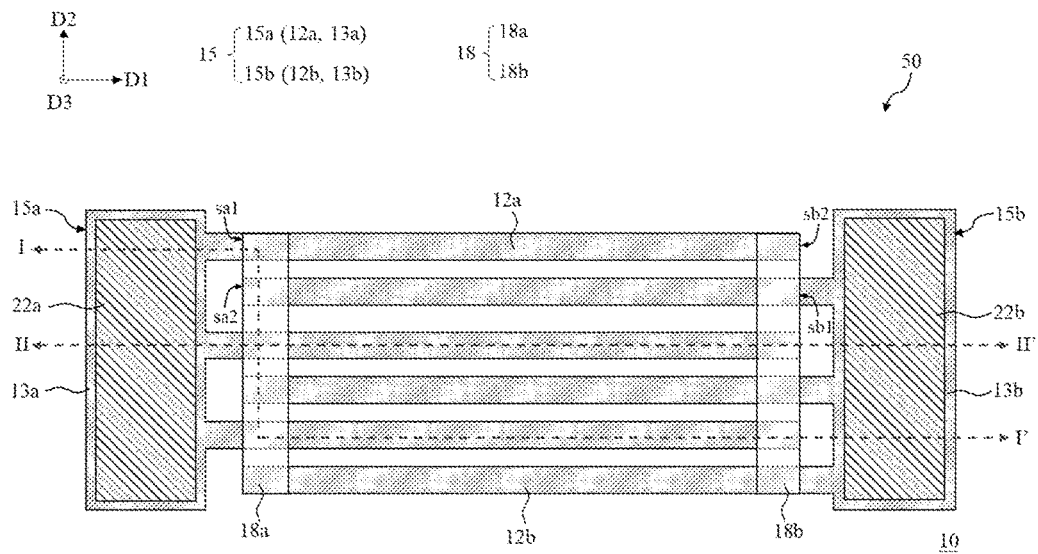
FIG. 1A is a schematic top view of a surface acoustic wave resonator structure.
Figure 1B:
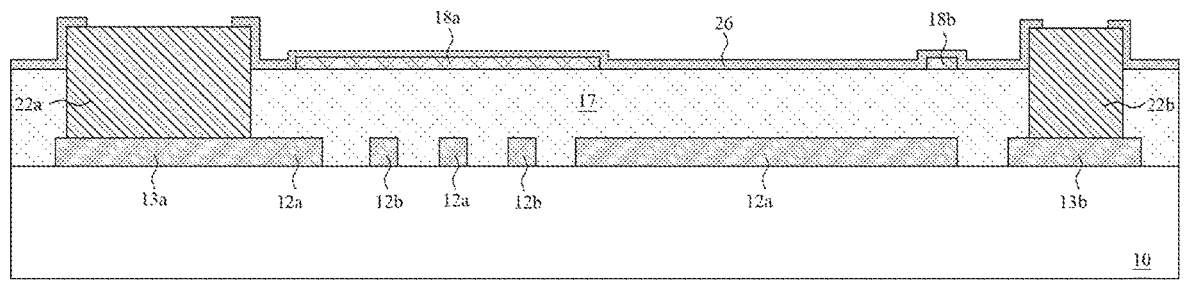
FIG. 1B is a schematic cross-sectional view of a surface acoustic wave resonator structure taken along a line I-I' of FIG. 1A.
Figure 1C:
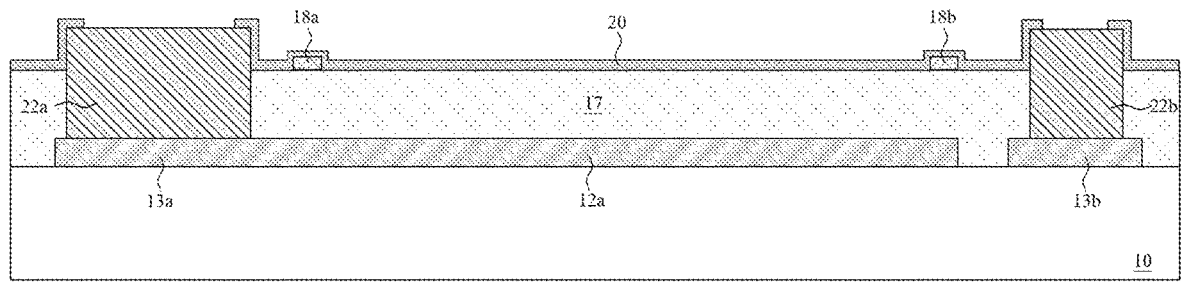
FIG. 1C is a schematic cross-sectional view of a surface acoustic wave resonator structure taken along a line II-II' of FIG. 1B.

FIG. 1A illustrates a schematic top view of a surface acoustic wave resonator structure; FIG. 1B and FIG. 1C illustrate schematic cross-sectional views of the surface acoustic wave resonator structure, and FIG. 1B and FIG. 1C are cross-sectional views respectively taken along a line I-I' and a line II-II' in FIG. 1A.

Referring to FIG. 1A to 1C, the surface acoustic wave resonator structure 50 may be or include a temperature compensated surface acoustic wave (TC-SAW) resonator. For example, the surface acoustic wave resonator structure 50 includes a piezoelectric substrate 10, an interdigital transducer (IDT) 15, a temperature compensation layer 17, a floating metal structure 18, a conductive connector 22a, a conductive connector 22b and a passivation layer 26.

The interdigital transducer 15 is disposed on the piezoelectric substrate 10, and includes an interdigital electrode structure 15a and an interdigital electrode structure 15b. The interdigital electrode structure 15a includes a plurality of interdigital electrodes 12a and an interdigital electrode lead-out part 13a connected to each other; the plurality of interdigital electrodes 12a extend substantially parallel to each other along a direction D1, and arranged along a direction D2. The direction D1 and the direction D2 are parallel to a main surface of the piezoelectric substrate 10 and intersect each other, for example, the direction D1 and the direction D2 are substantially perpendicular to each other. The interdigital electrode lead-out part 13a is located at ends of the plurality of interdigital electrodes 12a in the direction D1, and connected to the plurality of interdigital electrodes 12a, so that the plurality of interdigital electrodes 12a are electrically connected to each other through the interdigital electrode lead-out part 13a. Similar to the interdigital electrode structure 15a, the interdigital electrode structure 15b includes a plurality of interdigital electrodes 12b and an interdigital electrode lead-out part 13b connected to each other. The plurality of interdigital electrodes 12b extend along the direction D1 and are arranged along the direction D2; the interdigital electrode lead-out part 13b is located at ends of the plurality of interdigital electrodes 12b in the direction D1, and connected to the plurality of interdigital electrodes 12b.

The plurality of interdigital electrodes 12a and the plurality of interdigital electrodes 12b are alternately arranged along the direction D2 and spaced apart from each other. The interdigital electrode lead-out part 13a and the interdigital electrode lead-out part 13b are located on opposite sides of the plurality of interdigital electrodes 12a and 12b in the direction D1 and are respectively connected to the corresponding ends (e.g., first ends) of the plurality of interdigital electrodes 12a and the corresponding ends (e.g., first ends) of the plurality of interdigital electrodes 12b. The other ends of the plurality of interdigital electrodes 12a (e.g., second ends opposite to the first ends thereof in the direction D1) are facing or close to, and spaced apart from the interdigital electrode lead-out part 13b. The other ends of the plurality of interdigital electrodes 12b (e.g., second ends opposite to the first ends thereof in the direction D1) are facing or close to, and spaced apart from the interdigital electrode lead-out part 13a.

The temperature compensation layer 17 is disposed on a side of the piezoelectric substrate 10 with the interdigital transducer 15, and may cover sidewalls of the plurality of interdigital electrodes and the interdigital electrode lead-out parts of the interdigital transducer and surfaces of the plurality of interdigital electrodes and the interdigital electrode lead-out parts of the interdigital transducer away from the piezoelectric substrate 10. The temperature compensation layer 17 includes a material such as silicon oxide, for example.

The metal structure 18 is disposed on a side of the temperature compensation layer 17 away from the piezoelectric substrate 10. The metal structure 18 is electrically floating and electrically isolated from the interdigital transducer. For example, the metal structure 18 includes a plurality of metal strips 18a and 18b. The metal strips 18a and 18b may extend substantially parallel to each other along the direction D2 and each extend across the plurality of interdigital electrodes 12a and 12b. In other words, the metal strips 18a and 18b each overlap with the plurality of interdigital electrodes 12a and 12b in a direction (e.g., a direction D3) perpendicular to the main surface of the piezoelectric substrate 10. That is, in the direction perpendicular to the main surface of the piezoelectric substrate 10, an orthographic projection of each of the metal strips 18a and 18b on the main surface of the piezoelectric substrate 10 coincide (e.g., partially coincide) with orthographic projections of the plurality of interdigital electrodes 12a and 12b on the main surface of the piezoelectric substrate 10. The direction D3 may also be referred to as a third direction.

The metal strip 18a extends across the plurality of interdigital electrodes 12a and 12b, and is located over the ends (or edges) of the interdigital electrodes 12b away from the interdigital electrode lead-out part 13b; for example, the metal strip 18a has sidewalls (or edges) opposite to each other in the direction D1, and the sidewall (or edge) sa1 of the metal strip 18a away from the interdigital electrode lead-out part 13b and close to the interdigital electrode lead-out part 13a is substantially aligned with the sidewalls (or edges) sa2 of one or more interdigital electrodes 12b away from the interdigital electrode lead-out part 13b in a direction (e.g., the direction D3) perpendicular to the main surface of the piezoelectric substrate 10. The metal strip 18b extends across the plurality of interdigital electrodes 12a and 12b, and is located over the ends (or edges) of the interdigital electrodes 12a away from the interdigital electrode lead-out part 13a. For example, the metal strip 18b has sidewalls (or edges) opposite to each other in the direction D1, and the sidewall (or edge) of the metal strip 18b close to the interdigital electrode lead-out part 13b is substantially aligned with the sidewalls (or edges) sb2 of one or more interdigital electrodes 12a close to the interdigital electrode lead-out part 13b in a direction (e.g., the direction D3) perpendicular to the main surface of the piezoelectric substrate 10.

The conductive connector 22a and the conductive connector 22b are respectively disposed on sides of the interdigital electrode lead-out part 13a and the interdigital electrode lead-out part 13b away from the piezoelectric substrate 10. The conductive connector 22a is electrically connected to the interdigital electrode lead-out part 13a and overlapped with the interdigital electrode lead-out part 13a in the direction D3 perpendicular to the main surface of the piezoelectric substrate 10; the conductive connector 22b is electrically connected to the interdigital electrode lead-out part 13b and overlapped with the interdigital electrode lead-out part 13b in the direction D3 perpendicular to the main surface of the piezoelectric substrate 10. For example, the conductive connectors 22a and 22b extend through the temperature compensation layer 17 to be electrically connected to the corresponding interdigital electrode lead-out parts 13a and 13b, respectively. The conductive connectors 22a and 22b each protrude from a surface of the temperature compensation layer 17 at the side away from the piezoelectric substrate 10 in a direction perpendicular to the piezoelectric substrate 10 and away from the piezoelectric substrate.

The passivation layer 26 is disposed over the piezoelectric substrate 10, and covers sidewalls of the conductive connectors 22a and 22b, portions of surfaces of the conductive connectors at a side away from the piezoelectric substrate 10, a surface of the temperature compensation layer 17 at the side away from the piezoelectric substrate 10, sidewalls of the metal structure 18 and a surface of the metal structure 18 at a side away from the piezoelectric substrate 10. The passivation layer 26 may have a plurality of openings that respectively expose portions of the surfaces of the conductive connectors 22a and 22b at the side away from the piezoelectric substrate 10, so as to provide external connection windows.

In this example, the floating metal structure 18 can be used as a clutter suppression structure to suppress clutter wave in the resonator device, for example, can suppress clutter wave (which may also be referred to as a transverse wave in spurious mode) propagating in a direction parallel to the extension direction (e.g., the direction D1) of the interdigital electrodes. For example, during the operation of the surface acoustic wave resonator structure 50, the surface acoustic wave propagates along the arrangement direction (e.g., the direction D2) of the plurality of interdigital electrodes 12a and 12b of the interdigital transducer 15, however, there may further exist some clutter wave propagating along the extension direction (e.g., the direction D1) of the interdigital electrodes, and such clutter wave may cause energy loss and further result in degradation of performance of the resonator and/or the filter including the resonator. The clutter suppression structure including metal strips 18a and 18b respectively disposed on the edges of the two sets of interdigital electrodes can generate a region or interface where the acoustic wave propagation impedance changes, thereby suppressing the clutter wave propagating in the direction D1, and the clutter wave propagating in the direction D1 can be reflected back into the resonator, thereby reducing energy loss.

In this example, the floating metal structure 18 is overlapped with the interdigital electrodes and the temperature compensation layer 17 in a direction perpendicular to the piezoelectric substrate 10, and an equivalent capacitance will be formed between the floating metal structure 18 and the interdigital transducer 15. For example, portions of the floating metal structure 18 and the interdigital electrodes 12a, 12b that are overlapped with each other in the direction perpendicular to the main surface of the piezoelectric substrate 10 and the temperature compensation layer 17 between the portions of the floating metal structure 18 and the interdigital electrodes 12a, 12b may form an equivalent capacitance. However, under a certain voltage (e.g., a high voltage), a capacitive breakdown effect may occur; for example, when the intensity of the electric field formed between the floating metal structure 18 and the interdigital electrodes is too large, breakdown of the temperature compensation layer 17 may be caused, and this capacitive breakdown effect will affect the device reliability of the resonator and/or the filter including the resonator.

Regarding the above technical problems, the embodiments of the present disclosure provide a surface acoustic wave resonator device, a method of manufacturing the same, and a filter including the same. The surface acoustic wave resonator device includes: a piezoelectric substrate; an interdigital transducer, disposed on a side of the piezoelectric substrate, including an interdigital electrode region, and including a first interdigital electrode and a first interdigital electrode lead-out part connected to each other, a second interdigital electrode and a second interdigital electrode lead-out part connected to each other; wherein the first interdigital electrode and the second interdigital electrode are located in the interdigital electrode region, extending along a first direction and alternately arranged in a second direction, wherein the first direction intersect the second direction; the first interdigital electrode lead-out part and the second interdigital electrode lead-out part are located on opposite sides of the interdigital electrode region in the first direction; a first intermediate layer, disposed on a side of the piezoelectric substrate and covering the interdigital transducer; and a first conductive structure and a second conductive structure, located on a side of the first intermediate layer away from the piezoelectric substrate, spacing apart from each other in the first direction, and each overlapped with end portions of the first interdigital electrode and the second interdigital electrode in a third direction perpendicular to a main surface of the piezoelectric substrate, wherein the first conductive structure is electrically connected to one of the first interdigital electrode and the second interdigital electrode, and the second conductive structure is electrically connected to the other one of the first interdigital electrode and the second interdigital electrode.

In the embodiments of the present disclosure, the following technical effects can be achieved: the first conductive structure and the second conductive structure collectively constitute a clutter suppression structure to realize suppression of clutter wave in the resonator device; furthermore, the first conductive structure and the second conductive structure are further electrically connected to the corresponding interdigital electrodes, respectively. In this way, the first conductive structure and the second conductive structure can respectively form equivalent electrical potentials with the corresponding interdigital electrodes, thereby avoiding or reducing the possibility of breakdown being occurred to the intermediate layer between the first conductive structure and the interdigital electrodes and between the second conductive structure and the interdigital electrodes. That is to say, in the embodiments of the disclosure, the first conductive structure and the second conductive structure can avoid the formation of capacitive breakdown effect while suppressing clutter wave. Herein, two components forming an "equivalent electrical potential" represents that the electrical potentials of the two components are equal and the electrical potential difference between the two components is zero.

Figure 2A:
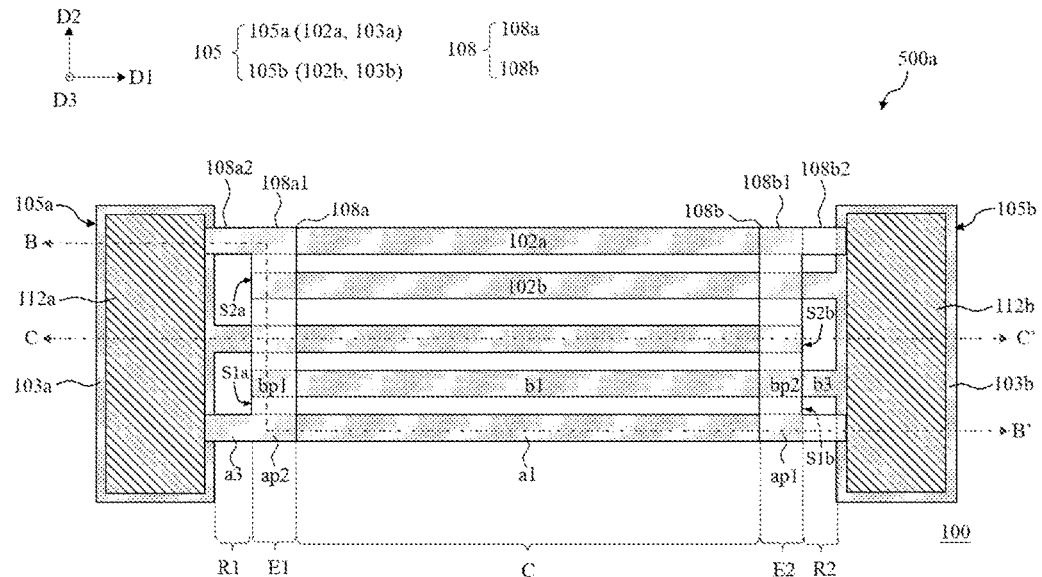
FIG. 2A is a schematic top view of a surface acoustic wave resonator device according to some embodiments of the present disclosure.
Figure 2B:
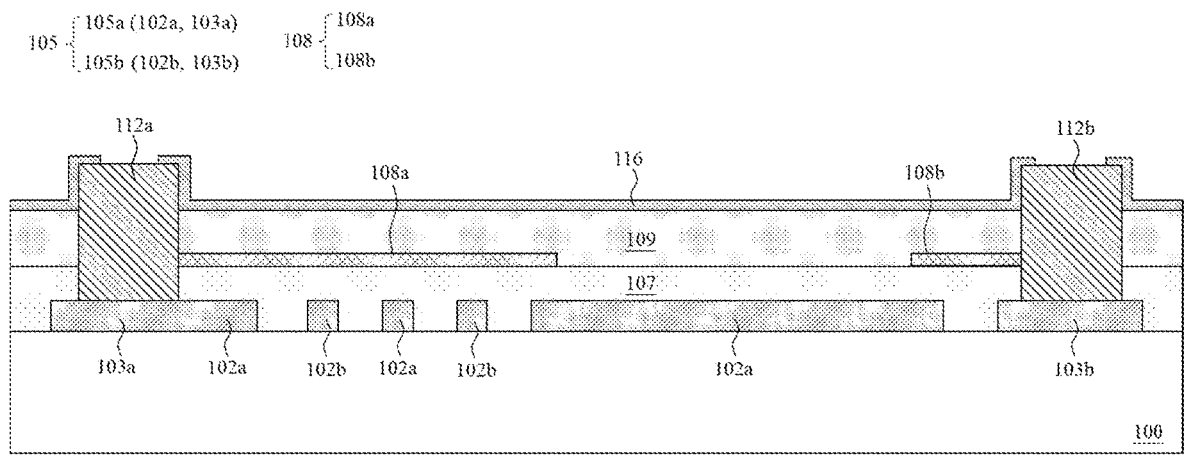
FIG. 2B is a schematic cross-sectional view of the surface acoustic wave resonator device according to some embodiments of the present disclosure, taken along a line B-B' of FIG. 2A.
Figure 2C:
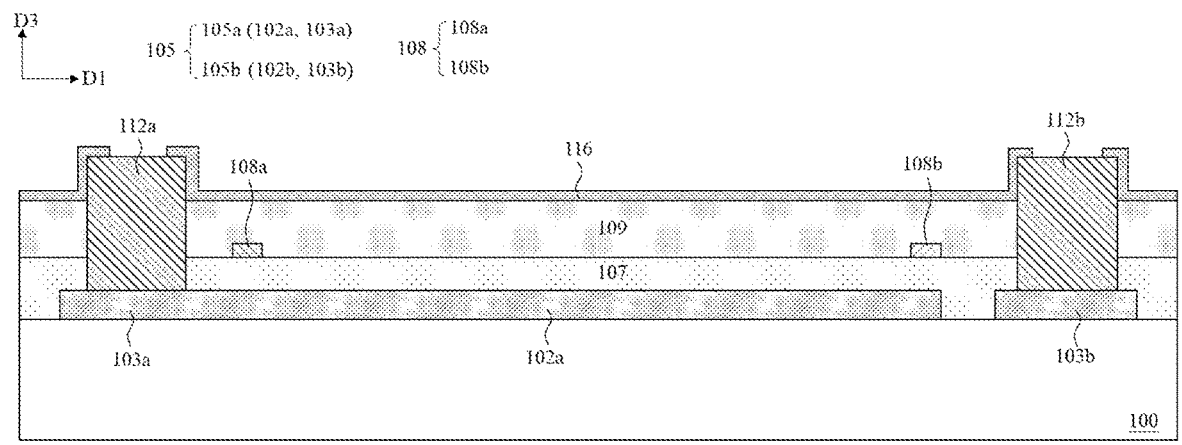
FIG. 2C is a schematic cross-sectional view of the surface acoustic wave resonator device according to some embodiments of the present disclosure taken along a line C-C' of FIG. 2A.

FIG. 2A is schematic top view of a surface acoustic wave resonator device according to some embodiments of the present disclosure; FIG. 2B and FIG. 2C are schematic cross-sectional views of the surface acoustic wave resonator device according to some embodiments of the present disclosure, and FIG. 2B and FIG. 2C are cross-sectional views respectively taken along a line B-B' and a line C-C' of FIG. 2A.

Referring to FIG. 2A to FIG. 2C, in some embodiments, the surface acoustic wave resonator device 500a includes a piezoelectric substrate 100, an interdigital transducer (IDT) 105, an intermediate layer 107, a conductive layer 108, an intermediate layer 109, a conductive connector 112a, a conductive connector 112b and a passivation layer 116. The intermediate layer 107 and the intermediate layer 109 may also be referred to as a first intermediate layer and a second intermediate layer, respectively. The conductive connector 112a and the conductive connector 112b may also be referred to as a first conductive connector and a second conductive connector, respectively.

In some embodiments, the interdigital transducer 105 is disposed on a side of the piezoelectric substrate 100 and includes an interdigital electrode structure 105a and an interdigital electrode structure 105b. The interdigital electrode structure 105a includes a plurality of interdigital electrodes 102a and an interdigital electrode lead-out part 103a connected to each other; the plurality of interdigital electrodes 102a substantially extend parallel to each other along a direction D1, and are arranged along a direction D2, the direction D1 and the direction D2 are parallel to a main surface (e.g., the surface close to or in contact with the interdigital transducer 105) of the piezoelectric substrate 100, and intersect each other, for example, the direction D1 and the direction D2 are substantially perpendicular to each other. In some embodiments, the interdigital electrode lead-out part 103a is located on a side of the plurality of interdigital electrodes 102a in the direction D1, and is connected to the plurality of interdigital electrodes 102a, so that the plurality of interdigital electrodes 102a are electrically connected to each other through the interdigital electrode lead-out part 103a. The interdigital electrode lead-out part may also be referred to as a busbar. The direction D1 and the direction D2 may also be referred to as a first direction and a second direction, respectively, or vice versa. Similar to the interdigital electrode structure 105a, the interdigital electrode structure 105b includes a plurality of interdigital electrodes 102b and an interdigital electrode lead-out part 103b connected to each other. The plurality of interdigital electrodes 102b extend along the direction D1 and are arranged along the direction D2; the interdigital electrode lead-out part 103b is located on a side of the plurality of interdigital electrodes 102b in the direction D1 and connected to the plurality of interdigital electrodes 102b.

In some embodiments, the plurality of interdigital electrodes 102a and the plurality of interdigital electrodes 102b are alternately arranged along the direction D2 and spaced apart from each other. The interdigital electrode lead-out part 103a and the interdigital electrode lead-out part 103b are located on opposite sides of the plurality of interdigital electrodes 102a and 102b in the direction D1, and are respectively connected to corresponding ends of the corresponding interdigital electrodes. For example, each interdigital electrode 102a has a first edge and a second edge opposite to each other in the direction D1, wherein the first edge is close to, facing and spaced apart from the interdigital electrode lead-out part 103b, and the second edge is connected to the interdigital electrode lead 103a. Each interdigital electrode 102b has a first edge and a second edge opposite to each other in the direction D1, wherein the first edge is close to, facing and spaced apart from the interdigital electrode lead-out part 103a, and the second edge is connected to the interdigital electrode lead 103b.

In some embodiments, the interdigital electrode structure 105a and the interdigital electrode structure 105b may also be referred to as a first interdigital electrode structure and a second interdigital electrode structure, respectively. The interdigital electrode 102a and the interdigital electrode 102b may also be referred to as a first interdigital electrode and a second interdigital electrode, respectively. The interdigital electrode lead-out part 103a and the interdigital electrode lead-out part 103b may also be referred to as a first interdigital electrode lead-out part and a second interdigital electrode lead-out part 103b, respectively.

In some embodiments, the conductive connector 112a and the conductive connector 112b are disposed on sides of the interdigital electrode lead-out part 103a and the interdigital electrode lead-out part 103b away from the piezoelectric substrate 100, and connected to the interdigital electrode lead-out part 103a and the interdigital electrode lead-out part 103b, respectively. The conductive connectors 112a and 112b may at least partially overlap the interdigital electrode lead-out parts 103a and 103b in a direction D3 perpendicular to the main surface of the piezoelectric substrate 100, respectively. For example, an orthographic projection of the conductive connector 112a on the piezoelectric substrate 100 may be located within a range of an orthographic projection of the interdigital electrode lead-out part 103a on the piezoelectric substrate 100; an orthographic projection of the conductive connector 112b on the piezoelectric substrate 100 may be located within a range of an orthographic projection of the interdigital electrode lead-out part 103b on the piezoelectric substrate 100, but the disclosure is not limited thereto. Herein, two components being overlapped with each other in a direction perpendicular to the piezoelectric substrate represents that the orthographic projections of the two components on the piezoelectric substrate in the said direction coincide with each other.

In some embodiments, the intermediate layer 107 is disposed on a side of the piezoelectric substrate 100 with the interdigital transducer 105, and may cover sidewalls of the plurality of interdigital electrodes and the interdigital electrode lead-out parts of the interdigital transducer 105 and surfaces of the plurality of interdigital electrodes and the interdigital electrode lead-out parts of the interdigital transducer 105 at the side away from the piezoelectric substrate 100. The material of the intermediate layer 107 may include one or more selected from a group consisting of silicon oxide ($SiO_2$), silicon nitride (SiN), aluminum nitride (AlN), amorphous silicon, gallium nitride and the like. The intermediate layer 107 may be a single-layer structure or a multi-layer structure. For example, the intermediate layer 107 may be a single-layer structure and include a material of silicon oxide; alternatively, the intermediate layer 107 may be a multi-layer structure and may include a stacked layer (e.g., as shown in FIG. 3E) of a silicon oxide layer and a non-silicon-oxide layer formed by a material such as silicon nitride (SiN), aluminum nitride (AlN), amorphous silicon, gallium nitride or the like, wherein the non-silicon-oxide layer is disposed between the silicon oxide layer and the interdigital transducer, and the thickness of the silicon oxide layer may be greater than the thickness of the non-siliconoxide layer. In some embodiments, the surface acoustic wave resonator device 500*a* may be or include a temperature compensated surface acoustic wave (TC-SAW) resonator device, and the intermediate layer may include a temperature compensation layer. For example, at least part of the intermediate layer 107 (e.g., the silicon oxide layer thereof) may serve as the temperature compensation layer.

In some embodiments, the conductive layer 108 is disposed on a side of the intermediate layer 107 away from the piezoelectric substrate 100 and overlapped with the interdigital transducer 105 in a direction (e.g., the direction D3) perpendicular to the main surface of the piezoelectric substrate 100. It should be understood that, in FIG. 2A, in order to clearly illustrate the positional relationship between the conductive layer 108 and the interdigital transducer 105, the conductive layer 108 is shown as transparent, but this does not represent that the structure must use a transparent material. For example, the conductive layer 108 may include any suitable metallic material. The conductive layer 108 may include a first conductive structure 108*a* and a second conductive structure 108*b* spaced apart from each other in the direction D1.

The first conductive structure 108*a* and the second conductive structure 108*b* may each overlap end portions of the interdigital electrodes 102*a* and 102*b* in the direction (e.g., the direction D3) perpendicular to the main surface of the piezoelectric substrate 100. For example, the first conductive structure 108*a* may extend across the plurality of interdigital electrodes 102*a* and 102*b* in the direction D2 and be electrically connected to the conductive connector 112*a*, and electrically connected to the interdigital electrodes 102*a* through the conductive connector 112*a*. The second conductive structure 108*b* may extend across the plurality of interdigital electrodes 102*a* and 102*b* in the direction D2 and be electrically connected to the conductive connector 112*b*, and may be electrically connected to the interdigital electrodes 102*b* through the conductive connector 112*b*.

For example, the interdigital transducer 105 has an interdigital electrode region and lead-out regions, and the lead-out regions are disposed on opposite sides of the interdigital electrode region in the direction D1. The plurality of interdigital electrodes 102*a* and 102*b* are disposed in the interdigital electrode region, and are alternately arranged along the direction D2 in the interdigital electrode region. The interdigital electrode lead-out parts 103*a* and 103*b* are respectively disposed in the lead-out regions on opposite sides of the interdigital electrode region. For example, the interdigital electrode region may include a central region C, a first end region E1, a second end region E2, a first connection region R1 and a second connection region R2. The first end region E1 and the second end region E2 are located on opposite sides of the central region C in the direction D1 and are connected to the central region C. The first connection region R1 is located on a side of the first end region E1 away from the central region C in the direction D1 and connected with the first end region E1. The second connection region R2 is located on a side of the second end region E2 away from the central region C in the direction D1 and connected with the second end region E2. The end region and the connection region in the interdigital electrode region may both be referred to as an interdigital electrode edge region.

In some embodiments, each interdigital electrode includes a central part located in the central region C, a first end part located in one of the first end region E1 and the second end region E2, a second end part located in the other one of the first end region E1 and the second end region E2, and a connection part located in one of first connection region R1 and the second connection region R2. In each interdigital electrode, the first end part and the second end part are located on opposite sides of the central part in a first direction (e.g., the direction D1), the connection part is located on a side of the second end part away from the central part, and connected to a corresponding one of the first interdigital electrode lead-out part and the second interdigital electrode lead-out part. It should be understood that, the central part, the first end part, the second end part and the connection part of each interdigital electrode are connected to each other and continuous, and may be integrally formed. In some embodiments, in each interdigital electrode structure, the interdigital electrodes and the interdigital electrode lead-out part may also be integrally formed. The first end part and the second end part of the interdigitated electrode may be collectively referred to as the end portion of the interdigitated electrode.

For example, each interdigital electrode 102*a* may include a central part a1 located in the central region C, a first end part ap1 located in the second end region E2, a second end part ap2 located in the first end region E1, and a connection part a3 located in the first connection region R1. Each interdigital electrode 102*b* may include a central part b1 located in the central region C, a first end part bp1 located in the first end region E1, a second end part bp2 located in the second end region E2, and a connection part b3 located in the second connection region R2.

In some embodiments, each of the first conductive structure 108*a* and the second conductive structure 108*b* includes a conductive body part and one or more conductive extension part connected to each other. The position of the conductive body parts are similar to the metal structure 18 as shown in FIG. 1A. For example, each conductive body part extends along the direction D2 and extends across the end parts of the plurality of interdigitated electrodes; the conductive extension part may be located on a side of the conductive body part away from the central parts of the interdigital electrodes in a direction (e.g., the direction D1) parallel to the main surface of the piezoelectric substrate, and electrically connects the conductive body part to the corresponding interdigital electrode lead-out part. In the direction D3 perpendicular to the main surface of the piezoelectric substrate 100, one or more conductive extension parts of each conductive structure may each not overlap either interdigital electrode 102*a* or 102*b*, or may overlap the corresponding connection part of interdigital electrode.

For example, the first conductive structure 108*a* may include a conductive body part 108*a*1 and at least one conductive extension part 108*a*2; the conductive body part 108*a*1 may be located on a side of (e.g., as shown in the figure, directly above) the first end region E1 of the interdigital electrode region away from the piezoelectric substrate 100. The conductive extension part 108*a*2 may be located on a side of (e.g., as shown in the figure, directly above) the first connection region R1 of the interdigital electrode region away from the piezoelectric substrate 100. The conductive body part 108*a*1 is electrically connected to the conductive connector 112*a* through the at least one conductive extension part 108*a*2, and further electrically connected to the plurality of interdigital electrodes 102*a* through the conductive connector 112*a*.

In the direction D3 perpendicular to the main surface of the piezoelectric substrate 100, the conductive body part 108*a*1 may be overlapped with the first end parts bp1 of the plurality of interdigital electrodes 102*b* and the second end parts ap2 of the plurality of interdigital electrodes 102*a*. For example, orthographic projections of the first end parts bp1 of the plurality of interdigital electrodes 102b and the second end parts ap2 of the plurality of interdigital electrodes 102a on the piezoelectric substrate 100 may be located within the range of the orthographic projection of the conductive body part 108a1 on the piezoelectric substrate 100. In some embodiments, the sidewall S1a of the conductive body part 108a1 close to the conductive connector 112a may be aligned with the sidewall(s) S2a (i.e., the sidewall of the first end part(s) bp1) of one or more interdigital electrodes 102b at the side close to the interdigital electrode lead-out part 103a in the direction D3, but the disclosure is not limited thereto.

In some embodiments, the first conductive structure 108a includes a plurality of conductive extension parts 108a2. For example, the plurality of conductive extension parts 108a2 may each extend along the direction D1 and may be arranged along the direction D2. Each conductive extension part 108a2 is located between the conductive body part 108a1 and the conductive connector 112a in the direction D1 and electrically connects the conductive body part 108a1 to the conductive connector 112a.

In some embodiments, in the direction D3 perpendicular to the main surface of the piezoelectric substrate 100, the conductive extension part 108a2 may overlap (e.g., partially overlap or completely overlap) or may not overlap the connection part a3 of the interdigital electrode 102a, and may overlap (e.g., partially overlap) or may not overlap the interdigital electrode lead-out part 103a; the conductive extension part 108a2 may not overlap the interdigital electrode 102b. In some embodiments, the orthographic projection of the conductive extension part 108a2 on the piezoelectric substrate 100 and the orthographic projection of the conductive connector 112a on the piezoelectric substrate 100 may border each other. For example, the conductive connector 112a may be in contact with a sidewall of conductive extension part 108a2 (e.g., a sidewall thereof away from the conductive body part 108a1).

For example, the second conductive structure 108b may include a conductive body part 108b1 and at least one conductive extension part 108b2; the conductive body part 108b1 may be located on a side of (e.g., as shown in the figure, directly above) the second end region E2 of the interdigital electrode region away from the piezoelectric substrate 100. The conductive extension part 108b2 may be located on a side of (e.g., as shown in the figure, directly above) the second connection region R2 of the interdigital electrode region away from the piezoelectric substrate 100. The conductive body part 108b1 is electrically connected to the conductive connector 112b through the at least one conductive extension part 108b2, and further electrically connected to the plurality of interdigital electrodes 102b through the conductive connector 112b.

In the direction D3 perpendicular to the main surface of the piezoelectric substrate 100, the conductive body part 108b1 may be overlapped with the first end parts ap1 of the plurality of interdigital electrodes 102a and the second end parts bp2 of the plurality of interdigital electrodes 102b. For example, orthographic projections of the first end parts ap1 of the plurality of interdigital electrodes 102a and the second end parts bp2 of the plurality of interdigital electrodes 102b on the piezoelectric substrate 100 may be located within the range of the orthographic projection of the conductive body part 108b1 on the piezoelectric substrate 100. In some embodiments, the sidewall S1b of the conductive body part 108b1 close to the conductive connector 112b may be aligned with the sidewall(s) S2b (i.e., the sidewall of the first end part(s) ap1) of one or more interdigital electrodes 102a at the side close to the interdigital electrode lead-out part 103b in the direction D3, but the disclosure is not limited thereto.

In some embodiments, the second conductive structure 108b includes a plurality of conductive extension parts 108b2. For example, the plurality of conductive extension parts 108b2 may each extend along the direction D1 and may be arranged along the direction D2. Each conductive extension part 108b2 is located between the conductive body part 108b1 and the conductive connector 112b in the direction D1 and electrically connects the conductive body part 108b1 to the conductive connector 112b.

In some embodiments, in the direction D3 perpendicular to the main surface of the piezoelectric substrate 100, the conductive extension part 108b2 may overlap (e.g., partially overlap or completely overlap) or may not overlap the connection part b3 of the interdigital electrode 102b, and may overlap (e.g., partially overlap) or may not overlap the interdigital electrode lead-out part 103b; the conductive extension part 108b2 may not overlap the interdigital electrode 102a. The orthographic projection of the conductive extension part 108b2 on the piezoelectric substrate 100 and the orthographic projection of the conductive connector 112b on the piezoelectric substrate 100 may border each other. For example, the conductive connector 112b may be in contact with a sidewall of conductive extension part 108b2 (e.g., a sidewall thereof away from the conductive body part 108b1).

In some embodiments, the conductive body parts 108a1 and 108a2 may extend parallel to each other along the direction D2 and be spaced apart from each other in the direction D1; for example, orthographic projections of the plurality of central parts a1 and b1 in the central region C on the piezoelectric substrate 100 may be located between the orthographic projections of the conductive body parts 108a1 and 108b1 on the piezoelectric substrate 100 in the direction D1. The conductive layer 108 may not overlap the plurality of central parts a1 and b1 in the direction D3. In some embodiments, in each of the conductive body parts 108a1 and 108a2, the opposite sidewalls thereof in the direction D2 may be respectively aligned with the sidewalls of the outermost interdigital electrodes in the direction D3. Alternatively, in each of the conductive body parts 108a1 and 108a2, one or two of the opposite sidewalls thereof in the direction D2 may extend beyond the sidewalls of the outermost interdigital electrodes in the direction D2. It should be understood that, the outermost interdigital electrode refers to the outermost one of the plurality of interdigital electrodes 102a and 102b arranged in the direction D2, such as the outermost two interdigital electrodes 102a shown in FIG. 2A. However, the present disclosure is not limited thereto. In some embodiments, the conductive body part 108a1 and the conductive body part 108b1 may also be referred to as a first conductive body part and a second conductive body part, respectively.

In this embodiment, all of the conductive extension parts 108a2 and 108b2 and the conductive body parts 108a1 and 108b1 are located on a side of the intermediate layer 107 away from the piezoelectric substrate 100, and the conductive extension parts 108a2 and 108b2 respectively extend from the conductive body parts 108a1 and 108b1 to being connected to the corresponding conductive connectors 112a and 112b in a direction (e.g., a horizontal direction such as the direction D1) parallel to the main surface of the piezoelectric substrate 100. In some embodiments, in the direction D3 perpendicular to the main surface of the piezoelectric substrate 100, the distance between the conductive extension part and the main surface of the piezoelectric substrate 100 may be substantially equal to the distance between the conductive body part and the main surface of the piezoelectric substrate 100. However, the present disclosure is not limited thereto.

In some embodiments, the first conductive structure 108a and the second conductive structure 108b may be symmetrical to each other, for example, with respect to a central line extending through the centers of the central parts a1 or b1 in a direction (e.g., the direction D2) parallel to the piezoelectric substrate 100. For example, one or more conductive extension parts 108a2 may be aligned with one or more conductive extension parts 108b2 in the direction D1, but the disclosure is not limited thereto.

Still referring to FIG. 2A to FIG. 2C, in some embodiments, the intermediate layer 109 is disposed on a side of the intermediate layer 107 away from the piezoelectric substrate 100 and covers sidewalls of the first conductive structure 108a and the second conductive structure 108b and surfaces of the first conductive structure 108a and the second conductive structure 108b at the side away from the piezoelectric substrate 100. The material of the intermediate layer 109 may be selected from the same candidate materials of the intermediate layer 107, which are not described again here. In some embodiments, at least a portion of intermediate layer 107 and at least a portion of intermediate layer 109 may together serve as the temperature compensation layer. The conductive connectors 112a and 112b extend through the intermediate layers 109 and 107 in the direction D3 perpendicular to the main surface of the piezoelectric substrate 100 and are electrically connected to the interdigital electrode lead-out parts 103a and 103b, respectively. The conductive connectors 112a and 112b may protrude from the surface of the intermediate layer 109 away from the piezoelectric substrate 100 in the direction D3 and in a direction away from the piezoelectric substrate 100. That is to say, the conductive connector 112a may have a portion embedded in the temperature compensation layer and a protruding portion protruded from the temperature compensation layer.

In some embodiments, the passivation layer 116 is disposed on a side of the temperature compensation layer (e.g., the intermediate layer 109) away from the piezoelectric substrate 100. For example, the passivation layer 116 covers the sidewalls of the protruding portions of the conductive connectors 112a and 112b and portions of the surfaces thereof at the side away from the piezoelectric substrate 100, and the surface of the temperature compensation layer (e.g., the intermediate layer 109) at the side away from the piezoelectric substrate 100. The passivation layer 116 may have a plurality of openings that respectively expose portions of the surfaces of the conductive connectors 112a and 112b at the side away from the piezoelectric substrate 100, so as to provide external connection windows.

In this embodiment, the conductive layer 108 can serve as a clutter suppression structure to achieve the effect of suppressing clutter wave, for example, can suppress clutter wave (which may also be referred to as a transverse wave in spurious mode) propagating in a direction parallel to the extension direction (e.g., the direction D1) of the interdigital electrodes. For example, during the operation of the surface acoustic wave resonator device 500a, the surface acoustic wave propagates along the arrangement direction (e.g., the direction D2) of the plurality of interdigital electrodes 102a and 102b of the interdigital transducer 105, however, there may further exist some clutter wave propagating along the extension direction (e.g., the direction D1) of the interdigital electrodes, and such clutter wave may cause energy loss and further result in degradation of performance of the resonator and/or the filter including the resonator. In the embodiments of the disclosure, the conductive structure (e.g., metal structure) disposed on the two end regions of the interdigital electrodes can generate a region or interface where the acoustic wave propagation impedance changes, thereby suppressing the clutter wave propagating in the direction D1, and the clutter wave propagating in the direction D1 can be reflected back into the resonator, thereby reducing energy loss.

On the other hand, in the conductive layer 108, the first conductive structure 108a is electrically connected to the conductive connector 112a, and further electrically connected to the interdigital electrode structure 105a through the conductive connector 112a, so that the first conductive structure 108a and the interdigital electrodes 102a are electrically connected to each other and have equivalent electrical potential, therefore, the electric field intensity between the first conductive structure 108a and the interdigital electrodes 102a is zero. The second conductive structure 108b is electrically connected to the conductive connector 112b, and further electrically connected to the interdigital electrode structure 105b through the conductive connector 112b, so that the second conductive structure 108b and the interdigital electrodes 102b are electrically connected to each other and have equivalent electrical potential, therefore, the electric field intensity between the second conductive structure 108b and the interdigital electrodes 102b is zero. In this way, the effect of alleviating breakdown issue can be achieved, that is, the possibility of electrical breakdown being occurred to the intermediate layer 107 located between the conductive layer 108 and the interdigital transducer 105 can be avoided or reduced, thereby improving the reliability of the resonator device. That is to say, in the embodiments of the present disclosure, the first conductive structure 108a and the second conductive structure 108b of the conductive layer 108 can avoid the capacitive breakdown effect while suppressing clutter wave.

FIG. 3A to FIG. 3L are schematic cross-sectional views illustrating structures in various process steps in a method of manufacturing the surface acoustic wave resonator device 500a according to some embodiments of the present disclosure.

Figure 3A:
FIG. 3A to FIG. 3L are schematic cross-sectional views illustrating schematic cross-sectional views of structures in various process steps among a method of manufacturing a surface acoustic wave resonator device according to some embodiments of the present disclosure.

Referring to FIG. 3A, a piezoelectric substrate 100 is provided. The piezoelectric substrate 100 may include a suitable piezoelectric material such as a piezoelectric crystal, a piezoelectric ceramic or the like. For example, the material of the piezoelectric substrate 100 may include aluminum nitride (AlN), doped aluminum nitride, zinc oxide (ZnO), lead zirconate titanate (PZT), lithium niobate (LiNbO$_3$), quartz, potassium niobate (KNbO$_3$), lithium tantalate (LiTaO$_3$), the like, or combinations thereof. In some embodiments, the piezoelectric substrate 100 may be a single-layer structure or a multi-layer structure, such as a piezoelectric film composite structure, such as a composite structure of lithium tantalate piezoelectric film/silicon dioxide/silicon substrate. In some embodiments, the piezoelectric substrate 100 may be a monocrystalline piezoelectric substrate. However, the present disclosure is not limited thereto.

Figure 3B:
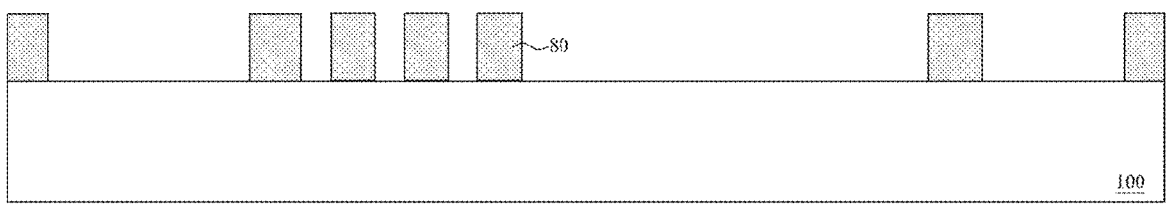

Referring to FIG. 3B, a mask layer 80 is formed on the piezoelectric substrate 100. The mask layer 80 may be or include a patterned photoresist layer; for example, the mask layer 80 may be formed by the following processes: a mask material layer (e.g., including a photoresist layer) is coated on the piezoelectric substrate 100, and a photolithography process including exposure and development is performed on the mask material layer, so as to pattern the mask material layer and form the mask layer 80. In some embodiments, the mask layer 80 has a pattern corresponding to the subsequently formed interdigital transducer. For example, the mask layer 80 has a plurality of openings, and the pattern of the plurality of openings is consistent with the pattern of the interdigital transducer. For example, the plurality of openings may include a first interdigital electrode region and a first interdigital electrode lead-out region respectively corresponding to the subsequently formed interdigital electrodes and interdigital electrode lead-out part of the first interdigital electrode structure; and a second interdigital electrode region and a second interdigital electrode lead-out region respectively corresponding to the subsequently formed interdigital electrodes and interdigital electrode lead-out part of the second interdigital electrode structure.

Figure 3C:
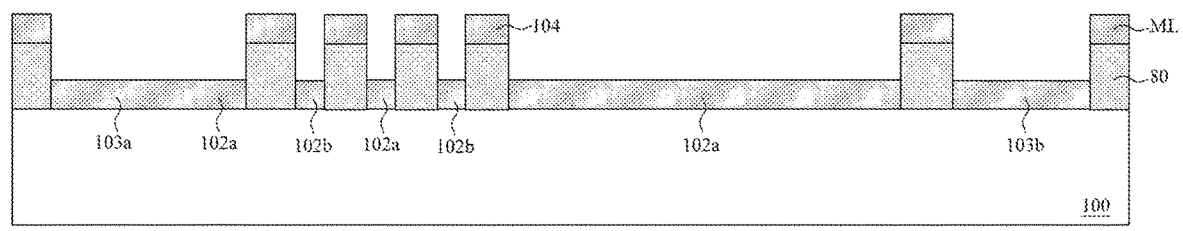

Referring to FIG. 3C, an electrode material layer ML is formed on the piezoelectric substrate 100 and the mask layer 80. The electrode material layer ML is formed in the openings of the mask layer 80 and on a surface of the mask layer 80 at the side away from the piezoelectric substrate 100. The portions of the electrode material layer ML formed in the openings of the mask layer 80 constitute the interdigital transducer 105; for example, the portions of the electrode material layer ML formed in the first interdigital electrode region, the first interdigital electrode lead-out region, the second interdigital electrode region, and the second interdigital electrode lead-out region of the openings of the mask layer 80 respectively form the interdigital electrodes 102a, the interdigital electrode lead-out part 103a, the interdigital electrodes 102b and the interdigital electrode lead-out part 103b. The portion 104 of the electrode material layer ML formed on the surface of the mask layer 80 at the side away from the piezoelectric substrate 100 will be removed in a subsequent process, and may also be referred to as a sacrificial portion.

In some embodiments, the electrode material layer ML may include a metal material, for example, may include one or more selected from a group consisting of Ti, Cr, Ag, Cu, Mo, Pt, W, Al, and other metal materials. The electrode material layer ML may be a single layer or a multi-layer structure, for example, may be a stacked layer of a combination of two or more of the above metal materials. The electrode material layer may be formed through a deposition process such as evaporation, but the disclosure is not limited thereto.

Figure 3D:
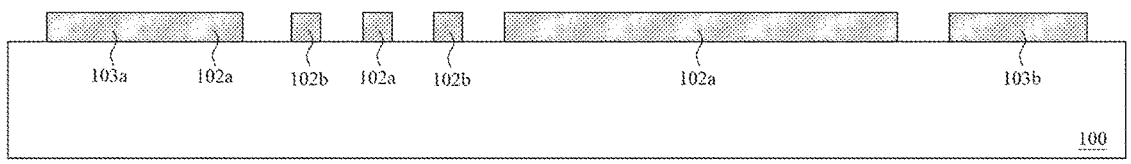
Figure 3E:
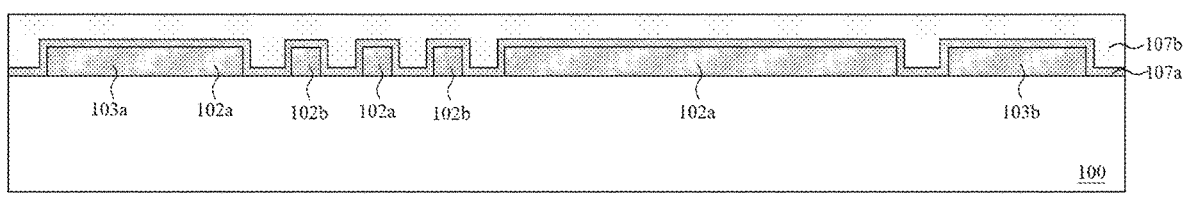

Referring to FIG. 3C and FIG. 3D, the mask layer 80 and the sacrificial portion 104 of the electrode material layer ML covering the mask layer 80 are removed, and the remaining electrode material layer constitute an interdigital transducer 105 including the interdigital electrodes 102a, 102b and the interdigital electrode lead-out parts 103a and 103b. In some examples, the mask layer 80 includes a photoresist material, and the mask layer 80 and the sacrificial portion 104 of the electrode material layer ML on the mask layer 80 may be removed by a lift-off process.

In the embodiments illustrated in FIG. 3B to FIG. 3D, a photoresist lift-off process is used to pattern the electrode material layer ML, so as to form the interdigital transducer 105, but the disclosure is not limited thereto. In some other embodiments, the following patterning process may also be used: a whole layer of electrode material layer ML may be formed on the piezoelectric substrate 100, and a patterned mask layer is then formed on the electrode material layer ML; thereafter, an etching process with the patterned mask layer as an etching mask is performed to etch the electrode material layer, thereby patterning the electrode material layer into an interdigital transducer; and thereafter, the patterned mask layer is removed.

Referring to FIG. 3E, an intermediate layer 107 is formed on the piezoelectric substrate 100 and the interdigital transducer 105. The intermediate layer 107 covers a surface of a side of the piezoelectric substrate 100, and covers sidewalls of the plurality of interdigital electrodes and the interdigital electrode lead-out parts of the interdigital transducer 105, and the surface thereof at the side away from the piezoelectric substrate 100. The intermediate layer 107 may include one or more dielectric materials and/or semiconductor materials, for example, may include an oxide material such as silicon oxide ($SiO_2$), a non-oxide material such as silicon nitride (SiN), aluminum nitride (AlN), amorphous silicon, gallium nitride (GaN), or combinations thereof. For example, one or more intermediate material layers may be formed by a deposition process such as CVD, PVD, etc., and a planarization process (e.g., chemical mechanical polishing (CMP) process) may be then performed on the intermediate material layer to form the intermediate layer 107 with a substantially flat surface.

In some embodiments, the intermediate layer 107 is a single-layer structure and may include silicon oxide, so as to serve as a temperature compensation layer. In alternative embodiments, the intermediate layer 107 is a multi-layer structure and may include a first intermediate sublayer 107a and a second intermediate sublayer 107b; the first intermediate sublayer 107a may extend along the surface of the interdigital transducer 105, and at least covers the sidewalls of the interdigital transducer 105 and the surface thereof at the side away from the piezoelectric substrate 100. The second intermediate sublayer 107b is located on a side of the first intermediate sublayer 107a away from the piezoelectric substrate 100 and the interdigital transducer 105. The interdigital transducer 105 and the second intermediate sublayer 107b may be separated from each other by the first intermediate sublayer 107a located therebetween.

For example, the first intermediate sublayer 107a may extend (e.g., continuously extend) along the surfaces of the piezoelectric substrate 100 and the interdigital transducer 105, cover and contact the surface of the piezoelectric substrate 100, the sidewalls of the interdigital transducer 105, and the surface of the interdigital transducer 105 at the side away from the piezoelectric substrate 100; for example, the first intermediate sublayer 107a may be a conformal layer and is conform with the piezoelectric substrate 100 and the interdigital transducer 105, but the present disclosure is not limited thereto. In some embodiments, the second intermediate sublayer 107b may include an oxide material such as silicon oxide, and may serve as the temperature compensation layer. The first intermediate sublayer 107a may be a non-silicon-oxide layer, and may include one or more selected from a group consisting of dielectric materials such as silicon nitride (SiN), aluminum nitride (AlN), and semiconductor materials such as amorphous silicon, gallium nitride (GaN), and the like. The first intermediate sublayer 107a may not include an oxide material. For example, the first intermediate sublayer 107a can serve as a protective layer to protect the interdigital transducer 105 from being oxidized. For example, the first intermediate sublayer 107b can be used to protect the interdigital transducer 105 from being oxidized during the process of forming the second intermediate sublayer 107b.

For example, in one example, the second intermediate sublayer 107b may be or include a silicon oxide layer deposited by a PVD process. During the PVD process, a silicon target is used as a sputtering target, and an appropriate amount of oxygen ($O_2$) is introduced into the deposition chamber to deposit and form the silicon oxide layer. In this embodiment, since the first intermediate sublayer 107a is formed before forming the second intermediate sublayer 107b, and the first intermediate sublayer 107a completely covers the sidewalls of the interdigital transducer 105 and the surface of the interdigital transducer 105 at the side away from the piezoelectric substrate 100, during the process of forming the second intermediate sublayer 107b (e.g., silicon oxide layer), the first intermediate sublayer 107a isolates the metal material of the interdigital transducer 105 from the oxygen gas in the deposition chamber, so as to prevent the interdigital transducer 105 from being oxidized during the process of the forming the intermediate layer 107, thereby avoiding issues such as degradation of device performance caused by oxidation of the interdigital transducer 105.

Figure 3F:
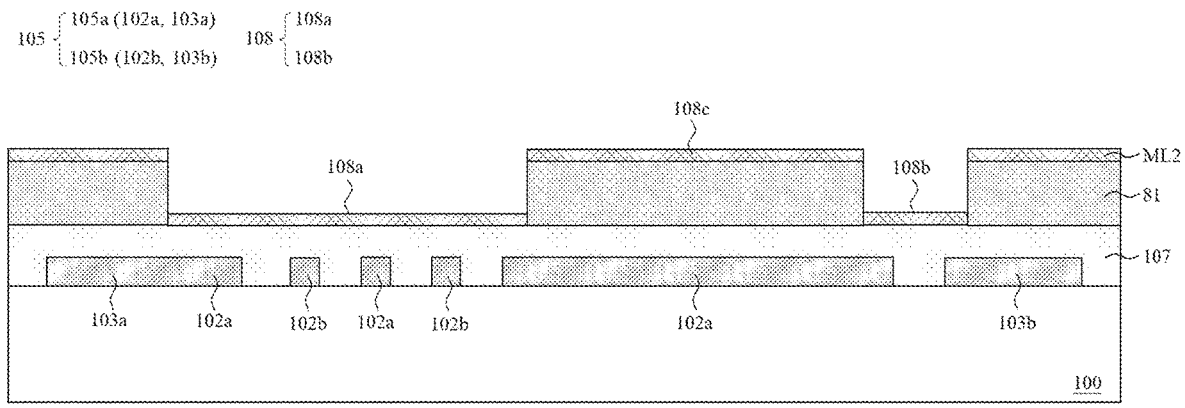

Referring to FIG. 3F, a mask layer 81 is formed on a side of the intermediate layer 107 away from the piezoelectric substrate 100. The mask layer 81 may be a patterned photoresist layer and has a pattern corresponding to the subsequent formed conductive layer 108. For example, the mask layer 81 has a plurality of openings that exposes portions of the surface of the intermediate layer 107 away from the piezoelectric substrate 100, and the pattern of the plurality of openings is consistent with the pattern of the conductive layer 108. For brevity of the drawings, the intermediate layer 107 is shown as a single layer in FIG. 3F and subsequent drawings, but it should be understood that the intermediate layer 107 may include a double-layer structure as shown in FIG. 3E.

A conductive material layer ML2 is formed on the intermediate layer 107. The conductive material layer ML2 fills in the openings of the mask layer 81 and covers a surface of the mask layer 81 at a side away from the intermediate layer 107. For example, the conductive material layer ML2 includes a portion formed in the opening of the mask layer 81 and serving as a first conductive structure 108a, a portion formed in the opening of the mask layer 81 and serving as a second conductive structure 108b, and a sacrificial portion 108c formed on a side of the mask layer 81 away from the intermediate layer 107. For example, the conductive material layer ML2 may include a metal material such as gold, tungsten, silver, titanium, platinum, aluminum, copper, molybdenum, the like, alloys thereof or combinations thereof, and may be formed by a deposition process such as evaporation.

Figure 3G:
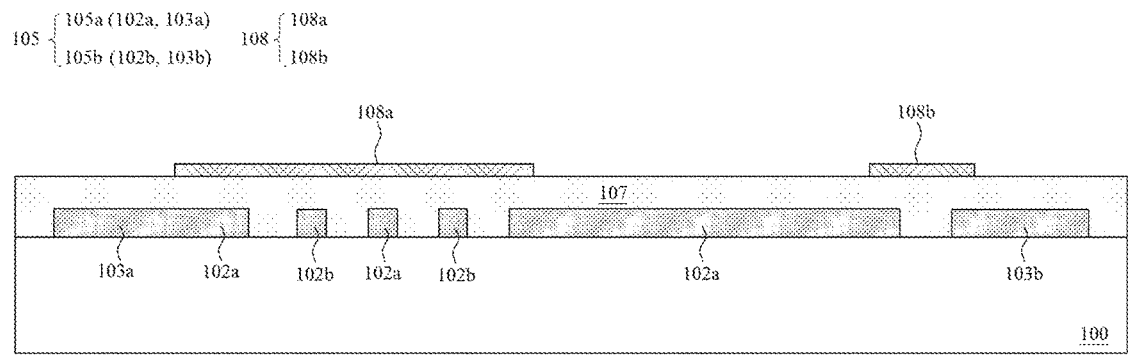

Referring to FIG. 3F and FIG. 3G, the mask layer 81 and the sacrificial portion 108c of the conductive material layer ML2 on the mask layer 81 are removed, and the remained first conductive structure 108a and second conductive structure 108b constitute the conductive layer 108. For example, the mask layer 81 and the sacrificial portion 108c may be removed by a lift-off process.

In this example, the conductive material layer ML2 is patterned through a photoresist lift-off process, but the disclosure is not limited thereto. In an alternative embodiment, the conductive material layer may be patterned by the following process: a conductive material layer may be firstly formed on the intermediate layer 107, and a patterned photoresist layer is then formed on the conductive material layer, thereafter, an etching process using the patterned photoresist layer as an etching mask is performed on the conductive material layer, so as to pattern the conductive material layer.

Figure 3H:
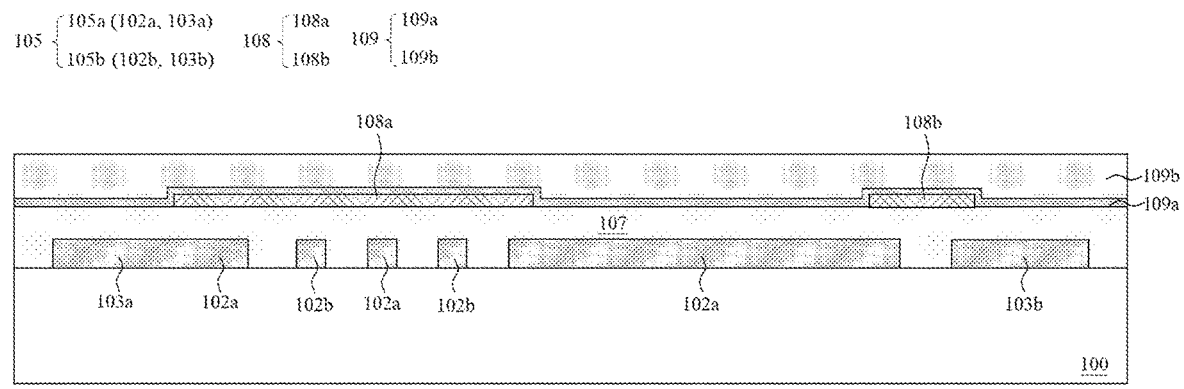

Referring to FIG. 3G and FIG. 3H, an intermediate layer 109 is formed on a side of the intermediate layer 107 away from the piezoelectric substrate 100. The intermediate layer 109 covers the surface of the intermediate layer 107 at the side away from the piezoelectric substrate 100 and covers the sidewalls of the conductive layer 108 and the surface of the conductive layer 108 at a side away from the intermediate layer 107. The intermediate layer 109 may include one or more dielectric materials and/or semiconductor materials, including, for example, silicon oxide ($SiO_2$), silicon nitride (SiN), aluminum nitride (AlN), amorphous silicon, gallium nitride (GaN) or combinations thereof. The material of the intermediate layer 109 may be the same as or different from the material of the intermediate layer 107. For example, an intermediate material layer may be formed by a deposition method such as CVD, PVD, etc., and a planarization process (e.g., a CMP process) may be then performed on the intermediate material layer to form the intermediate layer 109 with a substantially flat surface.

In some embodiments, the intermediate layer 109 is a single-layer structure and may include silicon oxide, so as to serve as the temperature compensation layer. In an alternative embodiment, the intermediate layer 109 is a multi-layer structure and may include a third intermediate sublayer 109a and a fourth intermediate sublayer 109b; the third intermediate sublayer 109a is located on the intermediate layer 107, and at least covers the sidewalls of the first conductive structure 108a and the second conductive structure 108b and surfaces thereof at the side away from the intermediate layer 107, and in some examples, may further covers the surface of the intermediate layer 107 at the side away from the piezoelectric substrate 100; the fourth intermediate sublayer 109b is located on the third intermediate sublayer 109a, for example, on a side of the third intermediate sublayer 109a away from the intermediate layer 107. The materials of the third intermediate sublayer 109a and the fourth intermediate sublayer 109b are different, and the conductive layer 108 and the fourth intermediate sublayer 109b are separated from each other by the third intermediate sublayer 109a located therebetween.

For example, the third intermediate sublayer 109a continuously extends along the surfaces of the intermediate layer 107 and the conductive layer 108, covers and contacts the surface of the intermediate layer 107 at the side away from the piezoelectric substrate 100, the sidewalls of the conductive layer 108 and the surface of the conductive layer 108 at the side away from the piezoelectric substrate 100; for example, the third intermediate sublayer 109a may be a conformal layer and conformal with the intermediate layer 107 and the conductive layer 108. The fourth intermediate sublayer 109b is formed on a side of the third intermediate sublayer 109a away from the conductive layer 108 and the intermediate layer 107. In some embodiments, the fourth intermediate sublayer 109b may include an oxide material such as silicon oxide, so as to serve as a temperature compensation layer. The third intermediate sublayer 109a may include a non-silicon-oxide material such as silicon nitride (SiN), aluminum nitride (AlN), amorphous silicon, gallium nitride (GaN), or the like, and may not include an oxide material, for example. The third intermediate sublayer 109a can be used as a protective layer to protect the conductive layer 108 from being oxidized. For example, during the process of forming the fourth intermediate sublayer 109b, the third intermediate sublayer 109a can protect the conductive layer 108 from being oxidized, thereby avoiding issues such as degradation in clutter suppression performance caused by oxidation of the conductive layer.

For example, in one example, the fourth intermediate sublayer 109b may be or include a silicon oxide layer and be deposited by a PVD process. During the PVD process, a silicon target is used as a sputtering target, and an appropriate amount of oxygen ($O_2$) gas is introduced into the deposition chamber to deposit and form the silicon oxide layer. In this embodiment, since the third intermediate sublayer 109a is formed before forming the fourth intermediate sublayer 109b, and the third intermediate sublayer 109a completely covers the sidewalls of the conductive layer 108 and the surface of the conductive layer 108 at the side away from the piezoelectric substrate 100, during the process of forming the fourth intermediate sublayer 109b (e.g., silicon oxide layer), the third intermediate sublayer 109a isolates the metal material of the conductive layer 108 from the introduced oxygen gas, so as to prevent the conductive layer 108 from being oxidized during the process of forming the fourth intermediate sublayer 109b, thereby avoiding issues such as degradation in clutter suppression performance caused by oxidation of the conductive layer 108.

At least a portion of the intermediate layer 107 and at least a portion of the intermediate layer 109 together constitute a temperature compensation layer. For example, when the intermediate layers 107 and 109 are both single-layer structures, the whole of the intermediate layers 107 and 109 together constitute the temperature compensation layer; when at least one of the intermediate layers 107 and 109 is a double-layer structure, portions of the intermediate layers 107 and 109 including oxide material layers (e.g., silicon oxide) together constitute the temperature compensation layer, while other portion(s) of the intermediate layers 107 and 109 serve as protection layer(s) to protect metal materials from being oxidized.

In this example, the third intermediate sublayer 109a continuously extends over the intermediate layer 107, and the intermediate layer 107 and the fourth intermediate sublayer 109b are separated by the third intermediate sublayer 109a located therebetween, but the present disclosure is not limited thereto. In an alternative embodiment, the third intermediate sublayer 109a may be formed to cover only the sidewalls of the conductive layer 108 and the surface of the conductive layer 108 at the side away from the intermediate layer 107, without covering the surface of a portion of the intermediate layer 107 that is not covered by the conductive layer 108, so that the formed fourth intermediate sublayer 109b is in contact with (not shown) the surface of the intermediate layer 107 (e.g., the second intermediate sublayer 107b) at the side away from the piezoelectric substrate 100.

Figure 3I:
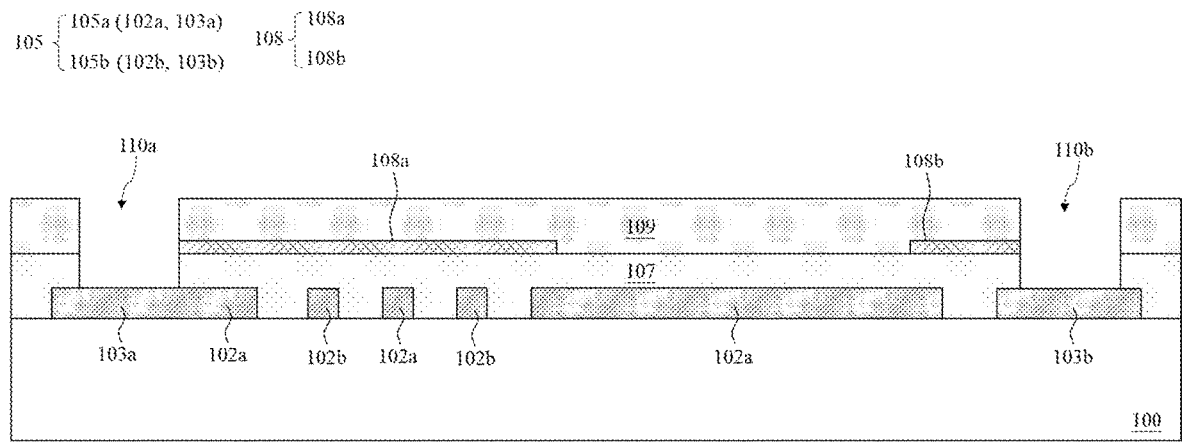

Referring to FIG. 3H to FIG. 3I, a patterning process is performed on the intermediate layers 109 and 107 to form openings 110a and 110b in the intermediate layers 109 and 107. The patterning process may include photolithography and etching processes. For the brevity of the drawings, in FIG. 3I and subsequent drawings, the intermediate layer 109 is shown as a single-layer structure, but it should be understood that the intermediate layer 109 may include a double-layer structure as shown in FIG. 3H.

Referring to FIG. 3I, the opening 110a extends through the intermediate layers 109 and 107 to partially expose the surface of the interdigital electrode lead-out part 103a at the side away from the piezoelectric substrate 100, and further at least exposes a sidewall of the first conductive structure 108a (e.g., the sidewall thereof at the side away from the second conductive structure 108b). The opening 110b extends through the intermediate layers 109 and 107 to partially expose the surface of the interdigital electrode lead-out part 103b at the side away from the piezoelectric substrate 100, and further at least exposes a sidewall of the second conductive structure 108b (e.g., the sidewall thereof at the side away from the first conductive structure 108a).

Figure 3J:
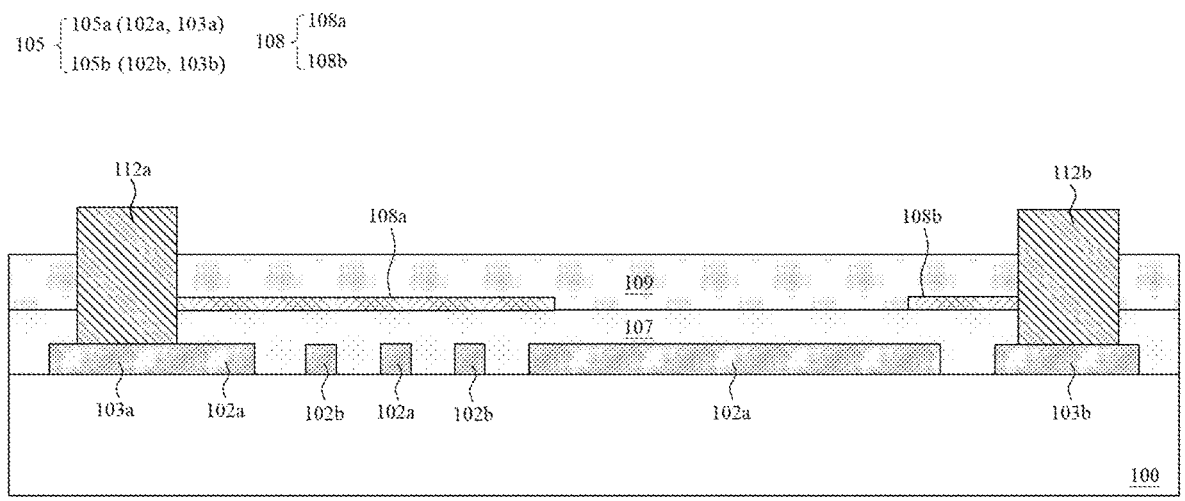

Referring to FIG. 3I and FIG. 3J, conductive connectors 112a and 112b are respectively formed in the openings 110a and 110b on the exposed portions of the interdigital electrode lead-out parts 103a and 103b. The conductive connector 112a is in contact with and electrically connected to the interdigital electrode lead-out part 103a at the bottom of the opening 110a, and is in contact with and electrically connected to the first conductive structure 108a at the sidewall of the opening 110a. The conductive connector 112b is in contact with and electrically connected to the interdigital electrode lead-out part 103b at the bottom of the opening 110b, and is in contact with and electrically connected to the second conductive structure 108b at the sidewall of the opening 110b. The conductive connectors 112a and 112b are electrically connected to the interdigital electrodes 102a and 102b through the interdigital electrode lead-out parts 103a and 103b, respectively, and the first conductive structure 108a and the second conductive structure 108b may be electrically connected to interdigital electrodes 102a and 102b through the conductive connectors 112a and 112b, respectively.

In the direction perpendicular to the main surface of the piezoelectric substrate 100, the conductive connectors 112a and 112b at least partially overlap the corresponding interdigital electrode lead-out parts 103a and 103b. In some embodiments, the conductive connectors 112a and 112b may protrude from a surface of the intermediate layer 109 at the side away from the piezoelectric substrate 100. The materials of the conductive connectors 112a and 112b may include metal materials such as Ti, Cr, Al, Cu, Ni, Ag, Au, or a stack of combination of the aforementioned materials. The material of the conductive connector may be the same as or different from the material of the interdigital transducer 105. In some embodiments, the forming method of the conductive connectors 112a and 112b may include a deposition process such as PVD and a patterning process such as a lift-off process.

Figure 3K:
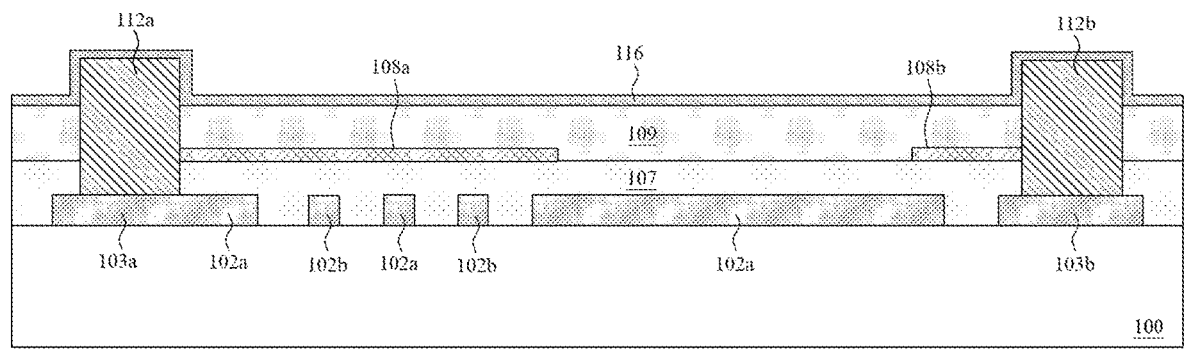

Referring to FIG. 3K, a passivation layer 116 is then formed on the intermediate layer 109 and the conductive connectors 112a and 112b to cover the surface of the intermediate layer 109 at the side away from the piezoelectric substrate 100, the sidewalls of portions of the conductive connectors 112a and 112b that protrudes from the intermediate layer 109 and the surfaces of the portions of the conductive connectors 112a and 112b at the side away from the piezoelectric substrate 100. In some embodiments, the material of the passivation layer 116 may include a dielectric material such as silicon nitride, aluminum nitride, the like, or combinations thereof.

Figure 3L:
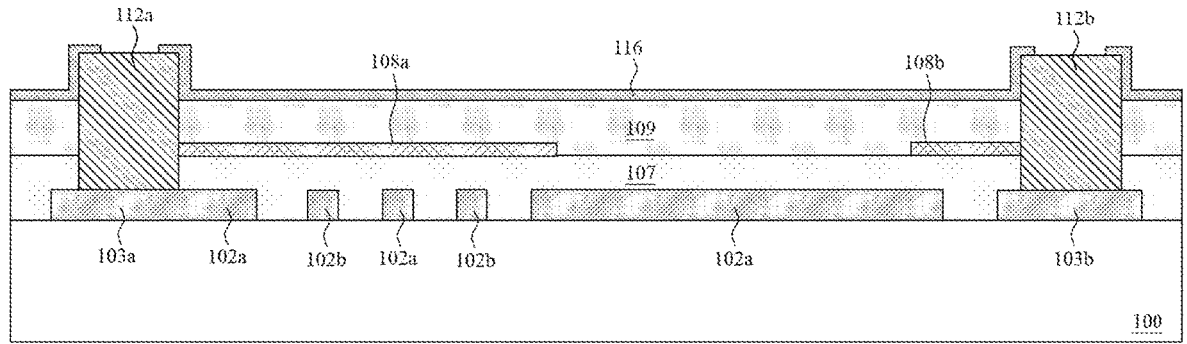

Referring to FIG. 3K and FIG. 3L, in some embodiments, a patterning process is performed on the passivation layer 116 to remove portions of the passivation layer 116 and form a plurality of openings in the passivation layer 116. The plurality of openings respectively expose portions of the surfaces of the conductive connectors 112a and 112b at the side away from the interdigital electrode lead-out parts 103a and 103b for external connection.

In this embodiment, the passivation layer 116 is formed on the intermediate layer 109 and spaced apart from the conductive layer 108, but the disclosure is not limited thereto. In alternative embodiments, the intermediate layer 109 may be omitted, and the passivation layer 116 may be directly formed on the intermediate layer 107 and the conductive layer 108a, similar to that shown in FIG. 1B and FIG. 1C.

Figure 4A:
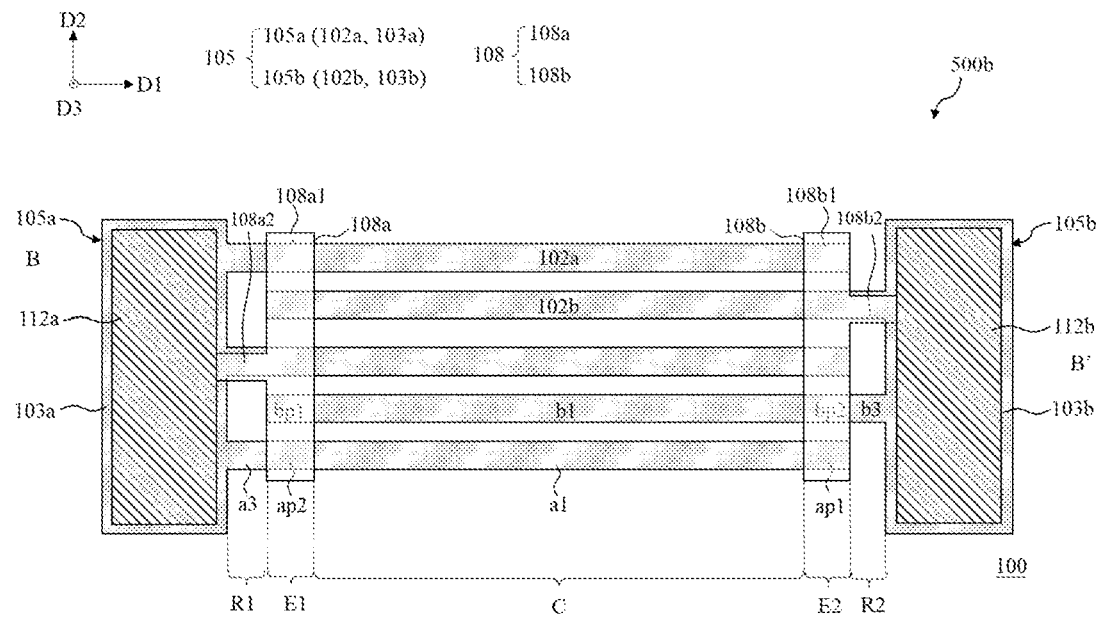
FIG. 4A is a schematic top view illustrating a surface acoustic wave resonator device according to some other embodiments of the present disclosure.
Figure 4B:
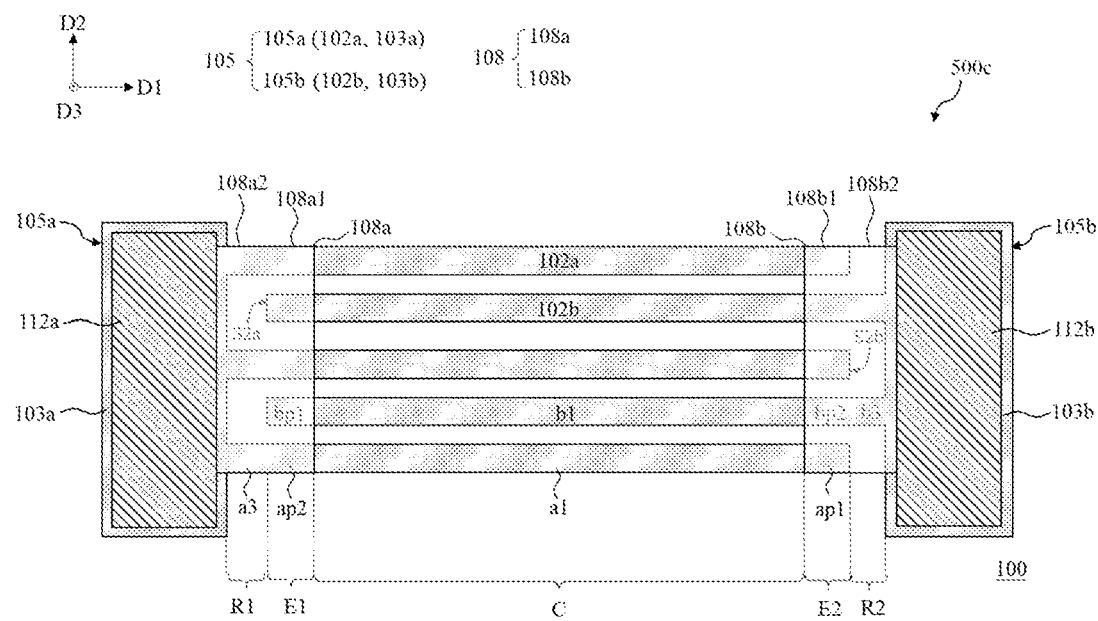
FIG. 4B is a schematic top view illustrating the surface acoustic wave resonator device according to some alternative embodiments of the present disclosure.
Figure 4C:
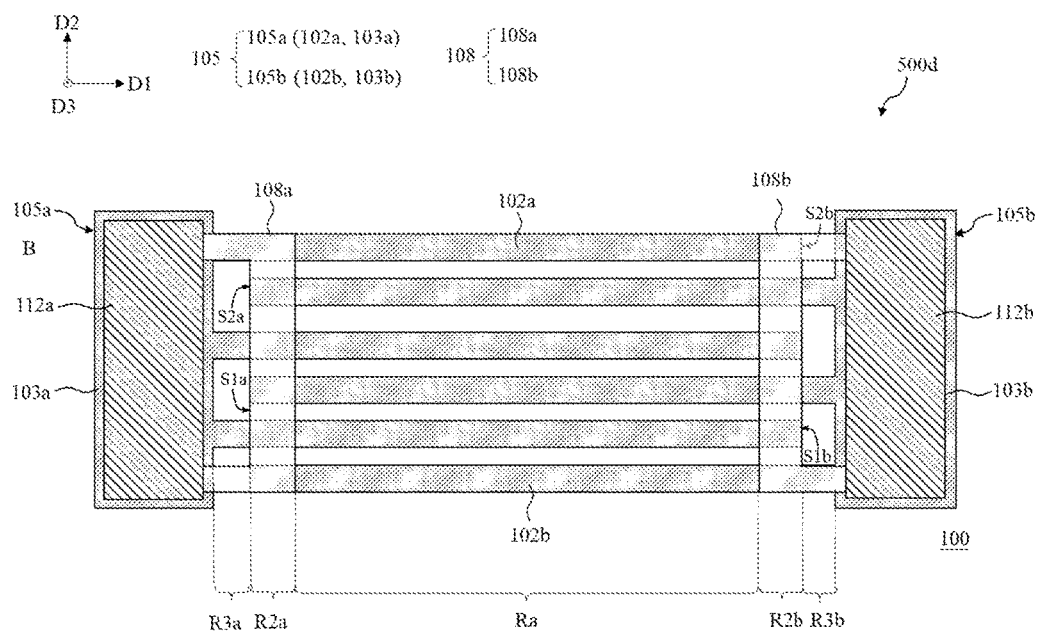
FIG. 4C is a schematic top view illustrating the surface acoustic wave resonator device according to yet other embodiments of the present disclosure.

FIG. 4A to FIG. 4C are schematic top views illustrating surface acoustic wave resonator devices according to some other embodiments of the present disclosure.

In the above embodiment, the first conductive structure 108a and the second conductive structure 108b each include two conductive extension parts, and the two conductive extension parts are respectively connected with two end portions of the corresponding conductive body part that are opposite in the direction D2. However, the present disclosure is not limited thereto. In each of the first conductive structure 108a and the second conductive structure 108b, the conductive extension part(s) may be located in any suitable position, as long as the electrical connection between the conductive body part and the corresponding interdigital electrode can be achieved.

For example, FIG. 4A and FIG. 4B illustrate examples in which the conductive extension parts of the surface acoustic resonator device are disposed in other manners. Referring to FIG. 4A, in the surface acoustic wave resonator device 500b, the first conductive structure 108a has a conductive body part 108a1 and one conductive extension part 108a2, and the second conductive structure 108b has a conductive body part 108b1 and one conductive extension part 108b2. The conductive extension parts 108a2 and 108b2 respectively connect the conductive body parts 108a1 and 108b1 to corresponding conductive connectors 112a and 112b, respectively. In each of the first conductive structure 108a and the second conductive structure 108b, the one conductive extension part can be located at any position on the side of the corresponding conductive body part close to the conductive connector, as long as the conductive extension part can realize the electrical connection between the conductive body part and the conductive connector, thereby realizing the electrical connection between the conductive body part and the corresponding interdigital electrode. For example, the conductive extension parts 108a2 and 108b2 may respectively be connected to the central parts of the conductive body part 108a1 and 108b1, the central part of the conductive body part refers to a part located between opposite ends thereof in the direction D2. In some embodiments, as shown in FIG. 4A, the first conductive structure 108a and the second conductive structure 108b (e.g., conductive body parts thereof) may extend beyond the edges (e.g., outer sidewalls) of outermost interdigital electrodes in the direction D2, the outermost interdigital electrodes are arranged at the outermost side among the plurality of interdigitated electrodes in the direction D2.

In the above embodiments, in each conductive structure, the size of the conductive extension part in the direction D2 is smaller than the size of the conductive body part in the direction D2, but the disclosure is not limited thereto. Referring to FIG. 4B, for example, in the first conductive structure 108a, the size of the conductive extension part 108a2 in the direction D2 may be substantially equal to the size of the conductive body part 108a1 in the direction D2; that is, the first conductive structure 108a may be a block structure or a planar structure as a whole, and continuously extends from a position above the first end region E1 across the first connection region R1 and extends to connect with the conductive connector 112a. Similarly, in the second conductive structure 108b, the size of the conductive extension part 108b2 in the direction D2 may also be substantially equal to the size of the conductive body part 108b1 in the direction D2; that is, the second conductive structure 108b may be a block structure or a planar structure as a whole, and continuously extends from a position above the second end region E2 across the second connection region R2 and extends to connect with the conductive connector 112b.

It should be understood that, the first conductive structure 108a and the second conductive structure 108b may each select any type of conductive extension part, and the types, sizes, numbers, etc., of the conductive extension parts of the first conductive structure and the second conductive structure may be the same as or different from each other.

In addition, the numbers of interdigital electrodes included in the interdigital electrode structures 105a and 105b may be the same or different. For example, in the foregoing embodiments, the numbers of the respective interdigital electrodes included in the interdigital electrode structures 105a and 105b are different. In some other embodiments, for example, as shown in FIG. 4C, the numbers of the respective interdigital electrodes included in the interdigital electrode structures 105a and 105b are the same as each other. It should be understood that, the numbers of respective interdigital electrodes included in the interdigital electrode structures 105a and 105b shown in the figures are merely for illustration, and the disclosure is not limited thereto. The number of interdigital electrodes in the interdigital electrode structure may be designed and adjusted according to actual product needs, and the size of the conductive structure can be set correspondingly according to the settings of the interdigitated electrodes, so that orthographic projections of the end portions of the plurality of interdigitated electrodes on the piezoelectric substrate are within the range of the orthographic projection of the corresponding conductive structure on the piezoelectric substrate.

In the embodiments shown in FIG. 4A to FIG. 4C, other features of the surface acoustic resonator devices 500b-500d are similar to those of the surface acoustic wave resonator device 500a, which are not described again here.

Figure 5A:
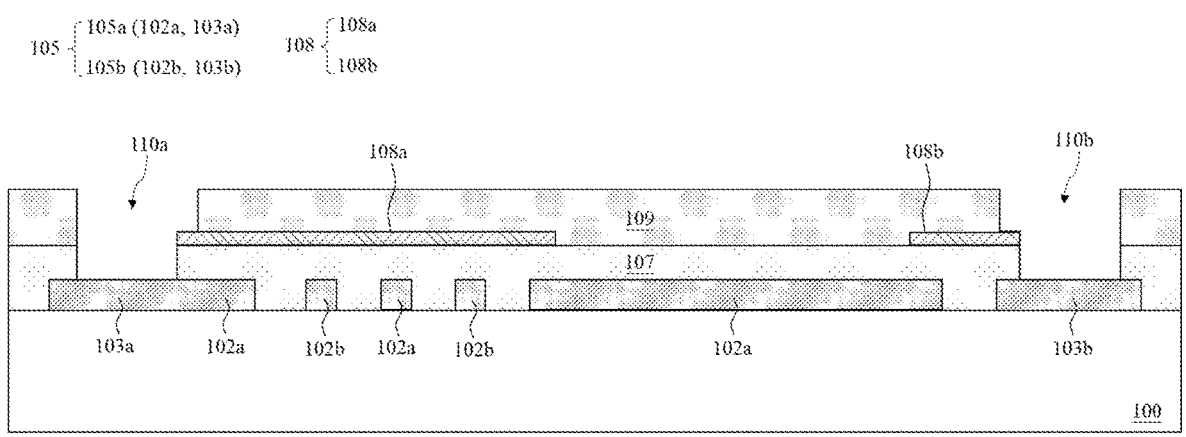
FIG. 5A is a schematic cross-sectional view illustrating an intermediate structure in a method of manufacturing a surface acoustic wave resonator device according to some other embodiments of the present disclosure.

FIG. 5A is a schematic cross-sectional view illustrating an intermediate structure in a process of forming openings 110a and 110b in intermediate layers 109 and 107 in a method of manufacturing a surface acoustic wave resonator device according to some other embodiments of the present disclosure. This embodiment is similar to the corresponding intermediate structure shown in FIG. 3I, except that the openings 110a and 110b in this embodiment further expose surfaces of the conductive structures at the side away from the piezoelectric substrate.

Referring to FIG. 3I and FIG. 5A, in some embodiments, the process of forming the conductive connectors 112a and 112b includes: forming openings in the intermediate layers 109 and 107, and then forming a conductive material to fill in the openings and form the conductive connectors. For example, a patterning process is performed on the intermediate layers 109 and 107 to form the openings 110a and 110b. The patterning process may include the following process: a mask layer is formed on a side of the intermediate layer 109 away from the intermediate layer 107; the mask layer may include, for example, a patterned photoresist layer formed by a photolithography process; the mask layer has mask openings corresponding to the openings 110a and 110b; thereafter, an etching process using the mask layer as an etching mask is performed on the intermediate layers 109 and 107, so as to remove portions of the intermediate layers exposed by the mask openings. The etching process may have a high etching selectivity ratio of the dielectric materials to conductive materials (e.g., metal materials), so that the etching process removes the portions of the intermediate layers 109 and 107 exposed by the mask openings, and the conductive layer 108 and the interdigital electrode lead-out parts 103a and 103b are substantially not removed by the etching process.

In some embodiments, the mask openings are disposed at least directly above the interdigital electrode lead-out parts 103a and 103b, and at least adjacent to the conductive structures 108a and 108b in the horizontal direction parallel with the main surface of the piezoelectric substrate 100, so that the formed openings 110a and 110b at least expose the sidewalls of the conductive structures, respectively. For example, as shown in FIG. 3I, the openings 110a and 110b of the intermediate layer just expose the sidewalls of the first conductive structure 108a and the second conductive structure 108b, and the subsequently formed conductive connector 112a and 112b are in contact with only the sidewalls of the first conductive structure 108a and the second conductive structure 108b, respectively. The orthographic projection of the conductive connector 112a on the piezoelectric substrate 100 and the orthographic projection of the first conductive structure 108a on the piezoelectric substrate 100 are adjacent to and connected to each other, but do not overlap each other; the orthographic projection of the conductive connector 112b on the piezoelectric substrate 100 and the orthographic projection of the second conductive structure 108b on the piezoelectric substrate 100 are adjacent to and connected to each other, but do not overlap each other.

In some other embodiments, portions of the mask openings of the mask layer may also be located directly above the corresponding conductive structures, so that the formed openings in the intermediate layer can expose the sidewalls of the corresponding conductive structures, and further expose portions of the surfaces of the corresponding conductive structures at the side away from the intermediate layer 107. For example, as shown in FIG. 5A, the openings 110a and 110b respectively extend through the intermediate layer 109 to expose the sidewalls of the first conductive structure 108a and the second conductive structure 108b and portions of the surfaces of the first conductive structure 108a and the second conductive structure 108b at the side away from the piezoelectric substrate 100, and further extend through the intermediate layer 107 to expose portions of the surfaces of the interdigital electrode lead-out parts 103a and 103b, respectively. In this embodiment, since the etching process has a high etching selectivity ratio of dielectric materials to conductive materials and substantially does not remove the conductive structure, the exposed portions of the first conductive structure 108a and the second conductive structure 108b may also serve as an etching mask, so that part of the intermediate layer 107 directly below the first conductive structure 108a and the second conductive structure 108b may not be removed by the etching process. As a result, in each of the openings 110a and 110b, the size in the horizontal direction of a part of the opening located in the intermediate layer 109 may be larger than the size in the horizontal direction of a part of the opening located in the intermediate layer 107.

Figure 5B:
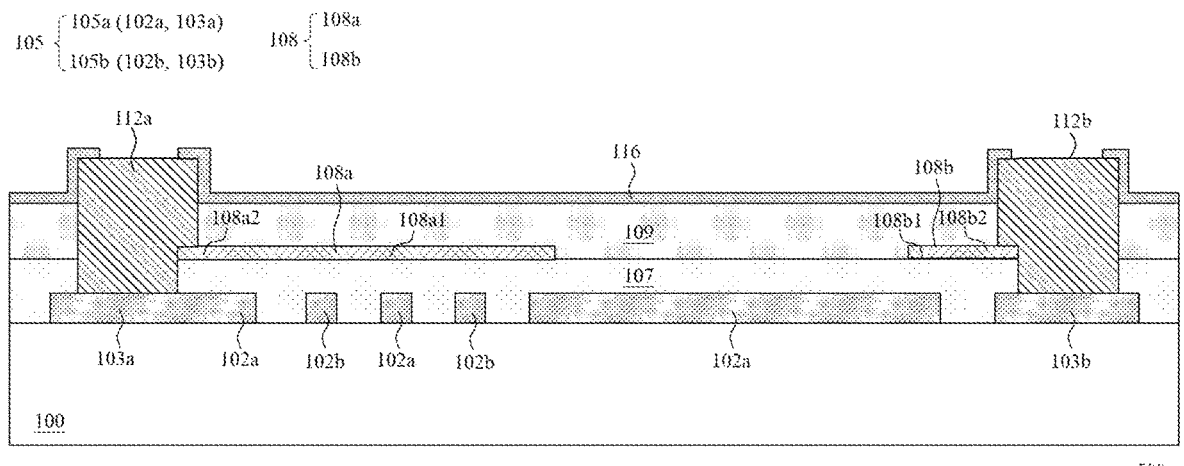
FIG. 5B is a schematic cross-sectional view of the surface acoustic wave resonator device according to some other embodiments of the present disclosure taken along the line B-B' of FIG. 2A.
Figure 5C:
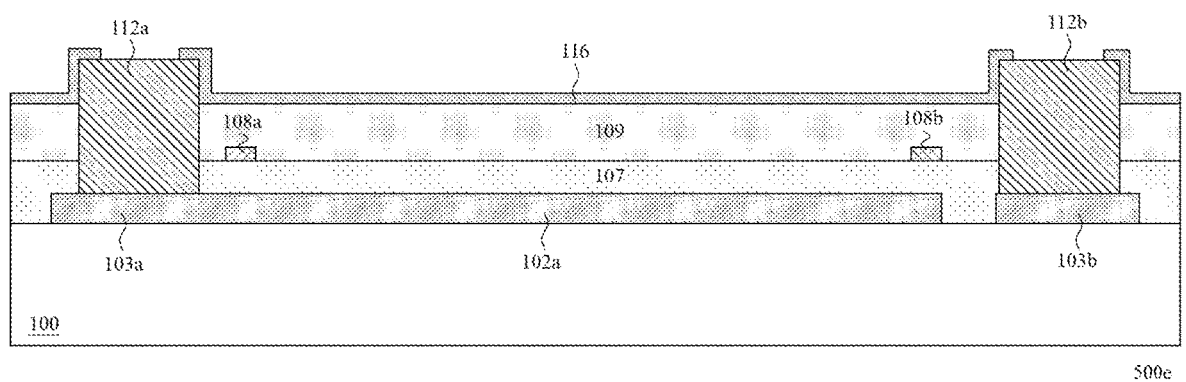
FIG. 5C is a schematic cross-sectional view of the surface acoustic wave resonator device according to some other embodiments of the present disclosure taken along the line C-C' of FIG. 2A.

Referring to FIG. 5B, in some embodiments, process steps substantially the same as those described above with reference to FIG. 3J to FIG. 3L are then performed to form components such as the conductive connectors 112a, 112b and the passivation layer 116, and a surface acoustic wave resonator device 500e is thus formed. FIG. 5C is another cross-sectional view of the surface acoustic wave resonator device 500c. For example, FIG. 5B and FIG. 5C are cross-sectional views respectively taken along a line B-B' and a line C-C' of FIG. 2A.

Referring to FIGS. 5B and 5C, in the surface acoustic wave resonator device 500e, the conductive connectors 112a and 112b respectively extend through the intermediate layer 109 to connect with the first conductive structure 108a and the second conductive structure 108b, and extend further through the intermediate layer 107 to connect with the interdigital electrode lead-out parts 103a and 103b, respectively. In this example, the conductive connector 112a contacts the sidewall of the first conductive structure 108a, and further covers and contacts a portion of the surface of the first conductive structure 108a at the side away from the intermediate layer 107; the conductive connector 112b contacts the sidewall of the second conductive structure 108b, and further covers and contacts a portion of the surface of the second conductive structure 108b at the side away from the intermediate layer 107. In some embodiments, the sidewall of an end part of the conductive extension part 108a2 of the first conductive structure 108a and a portion of a surface of the end part at the side away from the intermediate layer 107 are covered by and in direct contact with the conductive connector 112a, the end part of the conductive extension part 108a2 is an end part thereof away from the conductive body part 108a1. An orthographic projection of the end part of the conductive extension part 108a2 of the first conductive structure 108a on the piezoelectric substrate 100 and an orthographic projection of the conductive connector 112a on the piezoelectric substrate 100 are overlapped with each other. Similarly, the sidewall of an end part of the conductive extension part 108b2 of the second conductive structure 108b and a portion of a surface of the end part at the side away from the intermediate layer 107 are covered by and in direct contact with the conductive connector 112b, the end part of the conductive extension part 108b2 is an end part thereof away from the conductive body part 108b1. An orthographic projection of the end part of the conductive extension part 108b2 of the second conductive structure 108b on the piezoelectric substrate 100 and an orthographic projection of the conductive connector 112b on the piezoelectric substrate 100 are overlapped with each other.

In some embodiments, in a region where the conductive connector 112a partially overlap an end of the conductive extension part 108b2, the conductive connector 112a has a top portion and a bottom portion, and a size (e.g., width) of the top portion in the horizontal direction is greater than a size (e.g., width) of the bottom portion in the same horizontal direction, wherein the top portion is located on a side of the first conductive structure 108a away from the piezoelectric substrate 100, and covers the surface of the end of the conductive extension part 108a2 at the side away from the intermediate layer 107, the bottom portion is located on a lateral side of the first conductive structure 108a and a side of the first conductive structure 108a close to the piezoelectric substrate 100, and covers the sidewall of the conductive extension part 108a2 and extends toward the piezoelectric substrate to the interdigital electrode lead-out part 103a. Similarly, the conductive connector 112b may also have a top portion and a bottom portion with different sizes. These features are similar to those described above with respect to the conductive connector 112a, which are not described again here.

In some embodiments, as shown in FIG. 5C, in a region where the conductive connector does not overlap with corresponding conductive structure, the top portion and the bottom portion of the conductive connector may have substantially the same size in the horizontal direction, but the disclosure is not limited thereto.

Figure 6A:
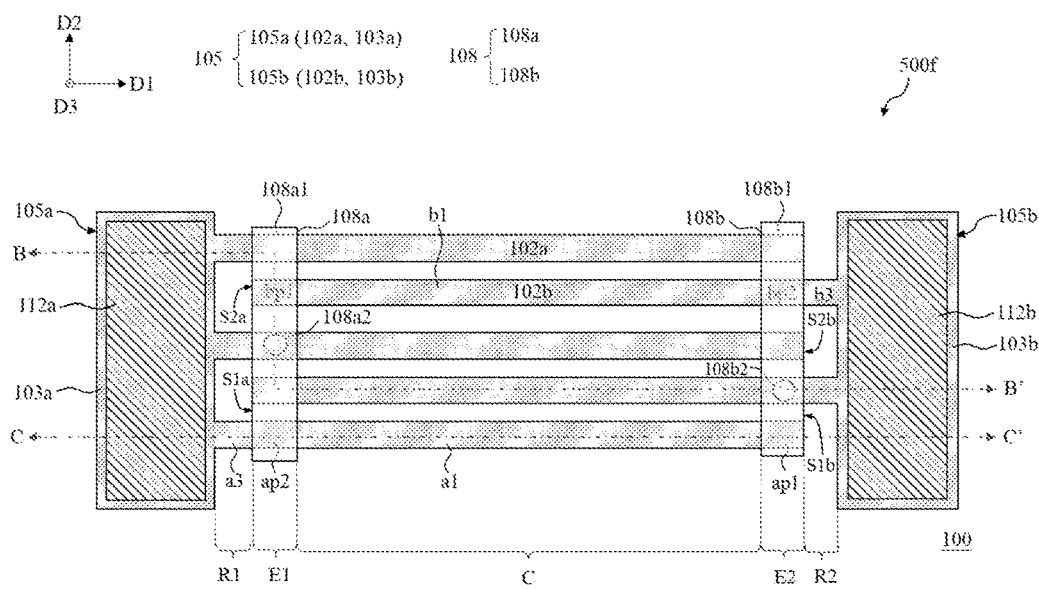
FIG. 6A is a schematic top view illustrating a surface acoustic wave resonator device according to yet other embodiments of the present disclosure.
Figure 6B:
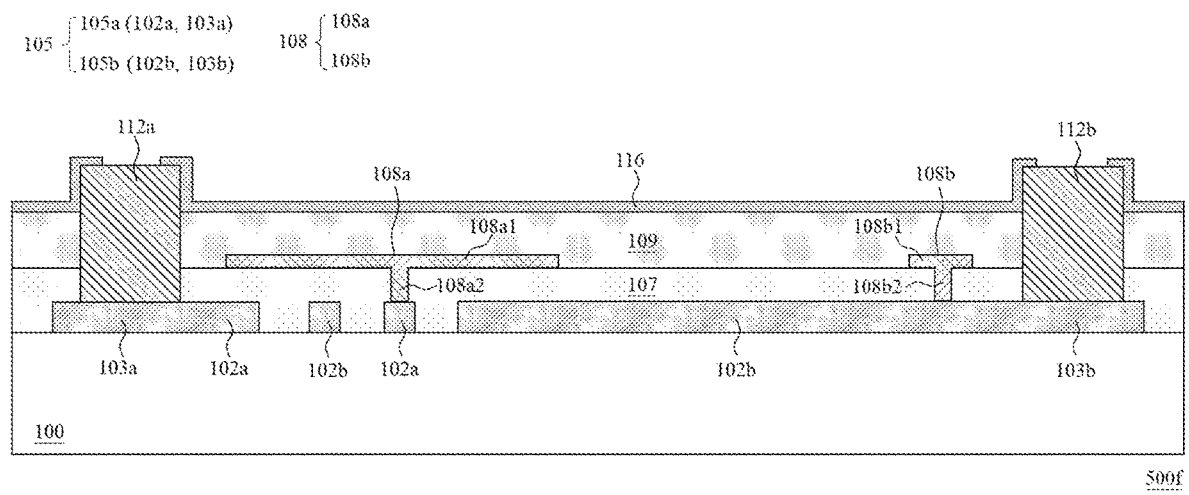
FIG. 6B is a schematic cross-sectional view of the surface acoustic wave resonator device according to yet other embodiments of the present disclosure taken along a line B-B' of FIG. 6A.

FIG. 6A illustrates a schematic top view of a surface acoustic wave resonator device 500f according to some other embodiments of the present disclosure, FIG. 6B illustrates a schematic cross-sectional view of the surface acoustic wave resonator device 500f according to some other embodiments of the present disclosure, wherein FIG. 6B is a cross-sectional view taken along a line B-B' of FIG. 6A, and a cross-sectional view taken along a line C-C' of FIG. 6A is substantially the same as the cross-sectional view of FIG. 2C, which is not illustrated again in this embodiment. The surface acoustic wave resonator device 500f is similar to the surface acoustic wave resonator devices described in the previous embodiments, except that the configuration of the conductive extension parts is different.

Referring to FIG. 6A and FIG. 6B, in the surface acoustic wave resonator device 500f, the first conductive structure 108a includes a conductive body part 108a1 and a conductive extension part 108a2, and the second conductive structure 108b includes a conductive body part 108b1 and a conductive extension part 108b2; the related features of the conductive body parts 108a1 and 108b1 are substantially the same as those described in the previous embodiments, which are not described again here.

In some embodiments, the conductive extension parts 108a1 and 108b2 may each include one or more conductive vias embedded in the intermediate layer 107; for example, the conductive extension part 108a2 extends in the direction D3, from a surface of the conductive body part 108a1 at the side close to the piezoelectric substrate 100, through the intermediate layer 107 and extends to the interdigital electrode 102a, for example, extends to be in contact with a surface of the interdigital electrode 102a at a side away from the piezoelectric substrate 100. That is to say, the conductive extension part 108a2 is located between the conductive body part 108a1 and the interdigital electrode 102a in the direction D3, and electrically connects the conductive body part 108a1 to the interdigital electrode 102a. For example, the conductive extension part 108b2 may extend in the direction D3, from a surface of the conductive body part 108b1 at the side close to the piezoelectric substrate 100, through the intermediate layer 107 and extends to the interdigital electrode 102b, for example, extends to be in contact with a surface of the interdigital electrode 102b at a side away from the piezoelectric substrate 100. That is to say, the conductive extension part 108b2 is located between the conductive body part 108b1 and the interdigital electrode 102b in the direction D3, and electrically connects the conductive body part 108b1 to the interdigital electrode 102b.

In the embodiment shown in FIG. 6A and FIG. 6B, the conductive extension parts 108a2 and 108b2 each include one conductive via, such that the conductive body part in each of the first conductive structure 108a and the second conductive structure 108b can be directly connected to a corresponding interdigital electrode through the one conductive via, and can be further electrically connected to other corresponding interdigital electrodes and interdigital electrode lead-out part through the interdigital electrode. However, the present disclosure is not limited thereto. In some other embodiments, the conductive extension parts 108a2 and 108b2 may each include a plurality of conductive vias; for example, the plurality of conductive vias of the conductive extension part 108a2 may be respectively located between the conductive body part 108a1 and the corresponding interdigital electrodes 102a; the plurality of conductive vias of the conductive extension part 108b2 may be respectively located between the conductive body part 108b2 and the corresponding interdigital electrodes 102b.

In this embodiment, the forming method of the surface acoustic wave resonator device 500f is similar to the surface acoustic wave resonator device 500a, except that the first conductive structure 108a and the second conductive structure 108b are formed in a slightly different way. For example, the formation of the first conductive structure and the second conductive structure may include the following processes: a patterning process is performed on the first intermediate layer to form a first via hole and a second via hole, the first via hole and the second via hole respectively expose portions of surfaces of the first interdigital electrode and the second interdigital electrode; a conductive material is formed on the first intermediate layer and in the first via hole and the second via hole, and a patterning process is performed on the conductive material to form the first conductive structure and the second conductive structure, wherein the first conductive structure and the second conductive structure are electrically connected to the first interdigital electrode and the second interdigital electrode through the first via hole and the second via hole, respectively.

For example, the method of forming the first conductive structure 108a and the second conductive structure 108b may include the following processes: before the step of FIG. 3F, the method further includes performing a patterning process on the intermediate layer 107 to form via holes in the intermediate layer 107, which exposes portions of surfaces of the interdigital electrodes 102a and 102b, respectively; thereafter, in the step of FIG. 3F, the formed conductive material layer ML2 is further filled into the via holes, so that in the step of FIG. 3G, the formed first conductive structure 108a and second conductive structure 108b have the structure shown in FIG. 6B, and are electrically connected to the corresponding interdigital electrodes through the via holes in the intermediate layer 107, respectively. In addition, in the subsequent process steps of forming the conductive connectors, the openings in the intermediate layer may not expose the first and second conductive structures, and the formed conductive connectors may not be directly connected to the first and second conductive structures.

In the surface acoustic wave resonator devices of various embodiments of the present disclosure, through disposing a conductive layer including a first conductive structure and a second conductive structure above the edge region of the interdigital electrodes as a clutter suppression structure, suppression of clutter wave in the resonator device can be realized; furthermore, the first conductive structure and the second conductive structure are electrically connected to the corresponding interdigital electrodes, such that an equivalent electrical potential is formed between the first conductive structure and the corresponding interdigital electrodes and an equivalent electrical potential is formed between the second conductive structure and the corresponding interdigital electrodes, thereby reducing or avoiding the possibility of breakdown being occurred to the intermediate layer (e.g., including a temperature compensation layer) that is located between the conductive layer and the interdigital electrodes, thereby ensuring the temperature compensation performance and device reliability of the resonator device. That is to say, the surface acoustic wave resonator devices according to the embodiments of the present disclosure can improve the device reliability which suppressing clutter wave.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

The invention claimed is:

1. A surface acoustic wave resonator device, comprising:
a piezoelectric substrate;
an interdigital transducer, disposed on a side of the piezoelectric substrate, having an interdigital electrode region, and comprising a first interdigital electrode and a first interdigital electrode lead-out part connected to each other, and a second interdigital electrode and a second interdigital electrode lead-out part connected to each other; wherein the first interdigital electrode and the second interdigital electrode are located in the interdigital electrode region, extending along a first direction and alternately arranged in a second direction, the first direction intersects the second direction; the first interdigital electrode lead-out part and the second interdigital electrode lead-out part are located on opposite sides of the interdigital electrode region in the first direction;
a first intermediate layer, disposed on the side of the piezoelectric substrate and covers the interdigital transducer; and
a first conductive structure and a second conductive structure, located on a side of the first intermediate layer away from the piezoelectric substrate, and spaced apart from each other in the first direction, wherein each of the first conductive structure and the second conductive structure is overlapped with end portions of the first interdigital electrode and the second interdigital electrode in a third direction perpendicular to a main surface of the piezoelectric substrate,
wherein the first conductive structure is electrically connected to one of the first interdigital electrode and the second interdigital electrode, and the second conductive structure is electrically connected to the other one of the first interdigital electrode and the second interdigital electrode.

2. The surface acoustic wave resonator device according to claim 1, wherein
the first interdigital electrode and the second interdigital electrode each comprise a central part, a first end part, a second end part and a connection part, and in each interdigital electrode, the first end part and the second end part are located on opposite sides of the central part in the first direction, and the connection part is located on a side of the second end part away from the central part, and connected to a corresponding one of the first interdigital electrode lead-out part and the second interdigital electrode lead-out part;
the first conductive structure comprises a first conductive body part and a first conductive extension part connected to each other, the first conductive body part is overlapped with the second end part of the first interdigital electrode and the first end part of the second interdigital electrode in the third direction, and the first conductive body part is electrically connected to the first interdigital electrode through the first conductive extension part; and
the second conductive structure comprises a second conductive body part and a second conductive extension part connected to each other, the second conductive body part is overlapped with the first end part of the first interdigital electrode and the second end of the second interdigital electrode in the third direction, and the second conductive body part is electrically connected to the second interdigital electrode through the second conductive extension part.

3. The surface acoustic wave resonator device according to claim 2, further comprising:
a first conductive connector, extending through the first intermediate layer to connect with the first interdigital electrode lead-out part, and electrically connected to the first interdigital electrode through the first interdigital electrode lead-out part; and
a second conductive connector, extending through the first intermediate layer to connect with the second interdigital electrode lead-out part, and electrically connected to the second interdigital electrode through the second interdigital electrode lead-out part,
wherein the first conductive structure is electrically connected to first interdigital electrode through the first conductive connector, and the second conductive structure is electrically connected to the second interdigital electrode through the second conductive connector.

4. The surface acoustic wave resonator device according to claim 3, wherein the first conductive connector is in contact with a sidewall of the first conductive extension part, and the second conductive connector is in contact with a sidewall of the second conductive extension part.

5. The surface acoustic wave resonator device according to claim 4, wherein
the first conductive connector further covers a portion of a surface of the first conductive extension part away from the first intermediate layer; and/or
the second conductive connector further covers a portion of a surface of the second conductive extension part away from the first intermediate layer.

6. The surface acoustic wave resonator device according to claim 3, wherein the first conductive extension part and the second conductive extension part are located on a side of the first intermediate layer away from the piezoelectric substrate; the first conductive extension part extends from the first conductive body part to being connected with the first conductive connector, and is further electrically connected to the first interdigital electrode through the first conductive connector; the second conductive extension part extends from the second conductive body part to being connected with the second conductive connector, and is further electrically connected to the second interdigital electrode through the second conductive connector.

7. The surface acoustic wave resonator device of claim 3, wherein an orthographic projection of the first conductive extension part on the piezoelectric substrate borders or overlaps an orthographic projection of the first conductive connector on the piezoelectric substrate, and an orthographic projection of the second conductive extension part on the piezoelectric substrate borders or overlaps an orthographic projection of the second conductive connector on the piezoelectric substrate.

8. The surface acoustic wave resonator device of claim 3, wherein the first conductive extension part overlaps the connection part of the first interdigital electrode in the third direction; and/or
the second conductive extension part overlaps the connection part of the second interdigital electrode in the third direction.

9. The surface acoustic wave resonator device according to claim 3, wherein the first conductive extension part overlaps the first interdigital electrode lead-out part in the third direction; and/or
the second conductive extension part overlaps the second interdigital electrode lead-out part in the third direction.

10. The surface acoustic wave resonator device of claim 2, wherein a sidewall of the first conductive body part is aligned with a sidewall of the first end part of the second interdigital electrode in the third direction; and/or
a sidewall of the second conductive body part is aligned with a sidewall of the first end part of the first interdigital electrode in the third direction.

11. The surface acoustic wave resonator device according to claim 2, wherein
the first conductive extension part is located between the first conductive body part and the first interdigital electrode in the third direction and extends through the first intermediate layer to connect the first conductive body part to the first interdigital electrode; and/or
the second conductive extension part is located between the second conductive body part and the second interdigital electrode in the third direction and extends through the first intermediate layer to connect the second conductive body part to the second interdigital electrode.

12. A surface acoustic wave resonator device according to claim 1, wherein the first intermediate layer comprises a temperature compensation layer.

13. The surface acoustic wave resonator device of claim 12, wherein the first intermediate layer comprises:
a first intermediate sublayer, extending along a surface of the interdigital transducer on the piezoelectric substrate; and
a second intermediate sublayer, located on a side of the first intermediate sublayer away from the piezoelectric substrate, and the first intermediate sublayer and the second intermediate sublayer comprise different materials;
wherein the interdigital transducer and the second intermediate sublayer are separated by the first intermediate sublayer.

14. The surface acoustic wave resonator device according to claim 1, further comprising:
a second intermediate layer, located on a side of the first intermediate layer away from the piezoelectric substrate, and covers the first conductive structure and the second conductive structure, wherein at least a portion of the first intermediate layer and at least a portion of the second intermediate layer together constitute a temperature compensation layer.

15. A filter, comprising the surface acoustic wave resonator device according to claim 1.

16. A method of manufacturing a surface acoustic wave resonator device, comprising:
providing a piezoelectric substrate;
forming an interdigital transducer on the piezoelectric substrate, wherein the interdigital transducer has an interdigital electrode region, and comprises a first interdigital electrode and a first interdigital electrode lead-out part connected to each other, and a second interdigital electrode and a second interdigital electrode lead-out part connected to each other; the first interdigital electrode and the second interdigital electrode are located in the interdigital electrode region, extending along a first direction and alternately arranged in a second direction, the first direction intersects the second direction; the first interdigital electrode lead-out part and the second interdigital electrode lead-out part are located on opposite sides of the interdigital electrode region in the first direction;
forming a first intermediate layer on a side of the piezoelectric substrate to cover the interdigital transducer; and
forming a first conductive structure and a second conductive structure on a side of the first intermediate layer away from the piezoelectric substrate, wherein the first conductive structure and the second conductive structure are spaced apart from each other in the first direction, and each of the first conductive structure and the second conductive structure is overlapped with end portions of the first interdigital electrode and the second interdigital electrode in a third direction perpendicular to a main surface of the piezoelectric substrate,
wherein the first conductive structure is electrically connected to one of the first interdigital electrode and the second interdigital electrode, and the second conductive structure is electrically connected to the other one of the first interdigital electrode and the second interdigital electrode.

17. The method of manufacturing the surface acoustic wave resonator device according to claim 16, further comprising:
forming a first conductive connector extending through the first intermediate layer to connect with the first interdigital electrode lead-out part; and
forming a second conductive connector extending through the first intermediate layer to connect with the second interdigital electrode lead-out part,
wherein the first conductive connector is further connected to the first conductive structure, and the second conductive connector is further connected to the second conductive structure.

18. The method of manufacturing the surface acoustic wave resonator device according to claim 17, further comprising:
forming a second intermediate layer on a side of the first intermediate layer away from the piezoelectric substrate to cover the first conductive structure and the second conductive structure, wherein forming the first conductive connector and the second conductive connector comprises:
performing a patterning process on the second intermediate layer and the first intermediate layer to form a first opening and a second opening, wherein the first opening extends through the second intermediate layer and the first intermediate layer to expose a portion of a surface of the first interdigital electrode lead-out part, and further expose at least a sidewall of the first conductive structure, and the second opening extends through the second intermediate layer and the first intermediate layer to expose a portion of a surface of the second interdigital electrode lead-out part, and further expose at least a sidewall of the second conductive structure; and forming the first conductive connector in the first opening and forming the second conductive connector in the second opening.

19. The method of manufacturing the surface acoustic wave resonator device according to claim 18, wherein the first opening further exposes a portion of a surface of the first conductive structure away from the first intermediate layer, so that the first conductive connector further contacts the portion of the surface of the first conductive structure, and/or the second opening further exposes a portion of a surface of the second conductive structure away from the first intermediate layer, so that the second conductive connector further contacts the portion of the surface of the second conductive structure.

20. The method of manufacturing the surface acoustic wave resonator device according to claim 16, wherein forming the first conductive structure and the second conductive structure comprises:

performing a patterning process on the first intermediate layer to form a first via hole and a second via hole, wherein the first via hole exposes a portion of a surface of the first interdigital electrode, and the second via hole exposes a portion of a surface of the second interdigital electrode; and forming a conductive material on the first intermediate layer and in the first via hole and the second via hole, and performing a patterning process on the conductive material to form the first conductive structure and the second conductive structure, wherein the first conductive structure is electrically connected to the first interdigital electrode through the first via hole, and the second conductive structure is electrically connected to the second interdigital electrode through the second via hole.

* * * * *